(12) United States Patent
Ludtke

(10) Patent No.: US 10,930,984 B2
(45) Date of Patent: Feb. 23, 2021

(54) BATTERY CHARGING SYSTEM AND MOBILE AND ACCESSORY DEVICES

(71) Applicant: Apple Inc., Cupertino, CA (US)

(72) Inventor: Harold Aaron Ludtke, San Jose, CA (US)

(73) Assignee: Apple Inc., Cupertino, CA (US)

( * ) Notice: Subject to any disclaimer, the term of this patent is extended or adjusted under 35 U.S.C. 154(b) by 619 days.

(21) Appl. No.: 15/391,870

(22) Filed: Dec. 28, 2016

(65) Prior Publication Data

US 2017/0200988 A1 Jul. 13, 2017

Related U.S. Application Data

(60) Continuation of application No. 13/573,515, filed on Sep. 18, 2012, now abandoned, which is a (Continued)

(51) Int. Cl.
*H02J 7/00* (2006.01)
*H01M 10/54* (2006.01)
(Continued)

(52) U.S. Cl.
CPC .......... *H01M 10/54* (2013.01); *G01R 31/371* (2019.01); *G01R 31/382* (2019.01);
(Continued)

(58) Field of Classification Search
CPC ........................ H01M 10/54; H01M 10/4285
(Continued)

(56) References Cited

U.S. PATENT DOCUMENTS 5,387,820 A 2/1995 Imagawa
5,544,784 A * 8/1996 Malaspina ................ G07F 7/00
221/135

(Continued)

OTHER PUBLICATIONS

Office Action dated Mar. 9, 2018 in U.S. Appl. No. 15/391,871, 30 pages.

(Continued)

*Primary Examiner* — Edward Tso
*Assistant Examiner* — Ahmed H Omar
(74) *Attorney, Agent, or Firm* — Kilpatrick Townsend & Stockton, LLP

(57) ABSTRACT

Various embodiments of the present invention are directed at a method and system for recharging batteries for wireless electronic devices. According to one embodiment, a battery charging and monitoring system is disclosed. The system includes a host machine providing a plurality of charging slots and a plurality of wireless devices coupled to and powered by a plurality of batteries. The host machine is adapted to communicate with the plurality of wireless devices through a plurality of wireless links to monitor the plurality of batteries coupled to the wireless devices. According to another embodiment, an electronic device is disclosed. The electronic device is adapted to couple with at least a rechargeable battery and to negotiate with the rechargeable battery for an agreed range of power parameters. The electronic device is further adapted to accept power from and to provide power to the rechargeable battery at the agreed range of power parameters.

20 Claims, 21 Drawing Sheets

Related U.S. Application Data continuation of application No. 12/715,392, filed on Mar. 2, 2010, now Pat. No. 8,269,453, which is a division of application No. 11/831,871, filed on Jul. 31, 2007, now Pat. No. 7,671,559.

(51) Int. Cl.

| | | |
|---|---|---|
| *G01R 31/371* | (2019.01) | |
| *G01R 31/382* | (2019.01) | |
| *H01M 10/48* | (2006.01) | |
| *H01M 2/10* | (2006.01) | |
| *H01M 10/42* | (2006.01) | |
| *H01M 10/44* | (2006.01) | |
| *H02J 7/02* | (2016.01) | |

(52) U.S. Cl.
CPC ....... *H01M 2/1022* (2013.01); *H01M 10/425* (2013.01); *H01M 10/4285* (2013.01); *H01M 10/441* (2013.01); *H01M 10/482* (2013.01); *H02J 7/0013* (2013.01); *H02J 7/0021* (2013.01); *H02J 7/00036* (2020.01); *H02J 7/0045* (2013.01); *H02J 7/0063* (2013.01); *H02J 7/0071* (2020.01); *H01M 2010/4271* (2013.01); *H01M 2220/30* (2013.01); *H02J 7/025* (2013.01); *H02J 2007/0067* (2013.01); *Y02W 30/84* (2015.05)

(58) Field of Classification Search
USPC ........................................................ 320/112
See application file for complete search history.

(56) References Cited

U.S. PATENT DOCUMENTS

| | | | |
|---|---|---|---|
| 5,557,188 A | 9/1996 | Piercey | |
| 5,615,395 A * | 3/1997 | Komaki | G03B 17/04 |
| | | | 396/6 |
| 5,734,253 A | 3/1998 | Brake et al. | |
| 5,778,325 A | 7/1998 | Lindell | |
| 5,780,991 A | 7/1998 | Brake et al. | |
| 5,898,290 A | 4/1999 | Beard | |
| 5,914,585 A | 6/1999 | Grabon | |
| 6,008,621 A | 12/1999 | Madison et al. | |
| 6,074,775 A | 6/2000 | Gartstein et al. | |
| 6,218,796 B1 | 4/2001 | Kozlowski | |
| 6,597,151 B1 | 7/2003 | Price et al. | |
| 6,686,086 B1 * | 2/2004 | Martin | H01M 6/52 |
| | | | 429/49 |
| 6,822,422 B2 * | 11/2004 | Sagawa | G06Q 10/06 |
| | | | 320/109 |
| 6,888,338 B1 | 5/2005 | Popescu-Stanesti et al. | |
| 6,913,087 B1 | 7/2005 | Brotto et al. | |
| 7,064,521 B2 | 6/2006 | Stanesti et al. | |
| 7,160,113 B2 | 1/2007 | McConnell et al. | |
| 7,227,333 B2 | 6/2007 | Yamada et al. | |
| 7,447,922 B1 | 11/2008 | Asbury et al. | |
| 7,581,119 B2 | 8/2009 | Tupman | |
| 7,671,559 B2 | 3/2010 | Ludtke | |
| 7,671,561 B2 | 3/2010 | Ludtke | |
| 7,701,171 B2 | 4/2010 | Defant et al. | |
| 8,269,453 B2 | 9/2012 | Ludtke | |
| 2002/0011823 A1 | 1/2002 | Lee | |
| 2002/0074970 A1 | 6/2002 | Kawashima | |
| 2002/0111874 A1 | 8/2002 | Al-Kazily | |
| 2003/0008201 A1 * | 1/2003 | Komori | H01M 2/12 |
| | | | 429/49 |
| 2003/0080713 A1 | 5/2003 | Kirmuss | |
| 2003/0209375 A1 * | 11/2003 | Suzuki | B60K 1/04 |
| | | | 180/65.22 |
| 2004/0113588 A1 * | 6/2004 | Mikuriya | H01M 10/4257 |
| | | | 320/128 |
| 2004/0160213 A1 | 8/2004 | Stanesti | |
| 2005/0003266 A1 * | 1/2005 | Wulff | G06F 1/1613 |
| | | | 429/97 |
| 2005/0048359 A1 | 3/2005 | Yamada et al. | |
| 2005/0110461 A1 | 5/2005 | McConnell et al. | |
| 2006/0091858 A1 * | 5/2006 | Johnson | B25F 5/00 |
| | | | 320/128 |
| 2006/0217152 A1 | 9/2006 | Fok et al. | |
| 2007/0046258 A1 | 3/2007 | Defant et al. | |
| 2007/0096691 A1 | 5/2007 | Duncan et al. | |
| 2007/0134546 A1 * | 6/2007 | Hashimoto | H01M 10/54 |
| | | | 429/49 |
| 2007/0165480 A1 * | 7/2007 | Wulff | G06F 1/1613 |
| | | | 365/230.06 |
| 2008/0111522 A1 | 5/2008 | Simpson | |
| 2008/0122518 A1 | 5/2008 | Besser et al. | |
| 2008/0203995 A1 | 8/2008 | Carrier et al. | |
| 2009/0035609 A1 | 2/2009 | Ludtke | |
| 2009/0039828 A1 | 2/2009 | Jakubowski | |
| 2009/0171178 A1 | 7/2009 | He et al. | |
| 2009/0321511 A1 * | 12/2009 | Browne | B03B 9/061 |
| | | | 235/375 |

OTHER PUBLICATIONS

Non-Final Office Action dated Mar. 30, 2009 for U.S. Appl. No. 11/831,897, 12 pages.
Non-Final Office Action dated Apr. 28, 2009 for U.S. Appl. No. 11/831,871, 9 pages.
Non-Final Office Action dated Oct. 5, 2010 for U.S. Appl. No. 12/715,392, 8 pages.
Final Office Action dated Jul. 13, 2011 for U.S. Appl. No. 12/715,392, 13 pages.
Non-Final Office Action dated Jun. 24, 2008 for U.S. Appl. No. 11/831,853, 9 pages.
Non-Final Office Action dated Aug. 5, 2009 for U.S. Appl. No. 11/831,853, 7 pages.
Non-Final Office Action dated Mar. 5, 2010 for U.S. Appl. No. 11/831,853, 10 pages.
Final Office Action dated Sep. 14, 2010 for U.S. Appl. No. 11/831,853, 7 pages.
Non-Final Office Action dated Jun. 20, 2011 for U.S. Appl. No. 11/831,853, 9 pages.
Final Office Action dated Jan. 10, 2012 for U.S. Appl. No. 11/831,853, 8 pages.
Non-Final Office Action dated Nov. 8, 2012 for U.S. Appl. No. 11/831,853, 10 pages.
Non-Final Office Action dated Aug. 6, 2013 for U.S. Appl. No. 11/831,853, 8 pages.
Notice of Allowance dated Oct. 26, 2009 for U.S. Appl. No. 11/831,897, 8 pages.
Notice of Allowance dated Oct. 27, 2009 for U.S. Appl. No. 11/831,871, 7 pages.
Non-Final Office Action dated Nov. 17, 2011 for U.S. Appl. No. 12/715,392, 13 pages.
Notice of Allowance dated Jun. 26, 2012 for U.S. Appl. No. 12/715,392, 5 pages.
Final Office Action dated Sep. 27, 2018 in U.S. Appl. No. 15/391,871, 32 pages.
Office Action dated Nov. 16, 2018 in U.S. Appl. No. 15/391,865, 38 pages.

\* cited by examiner

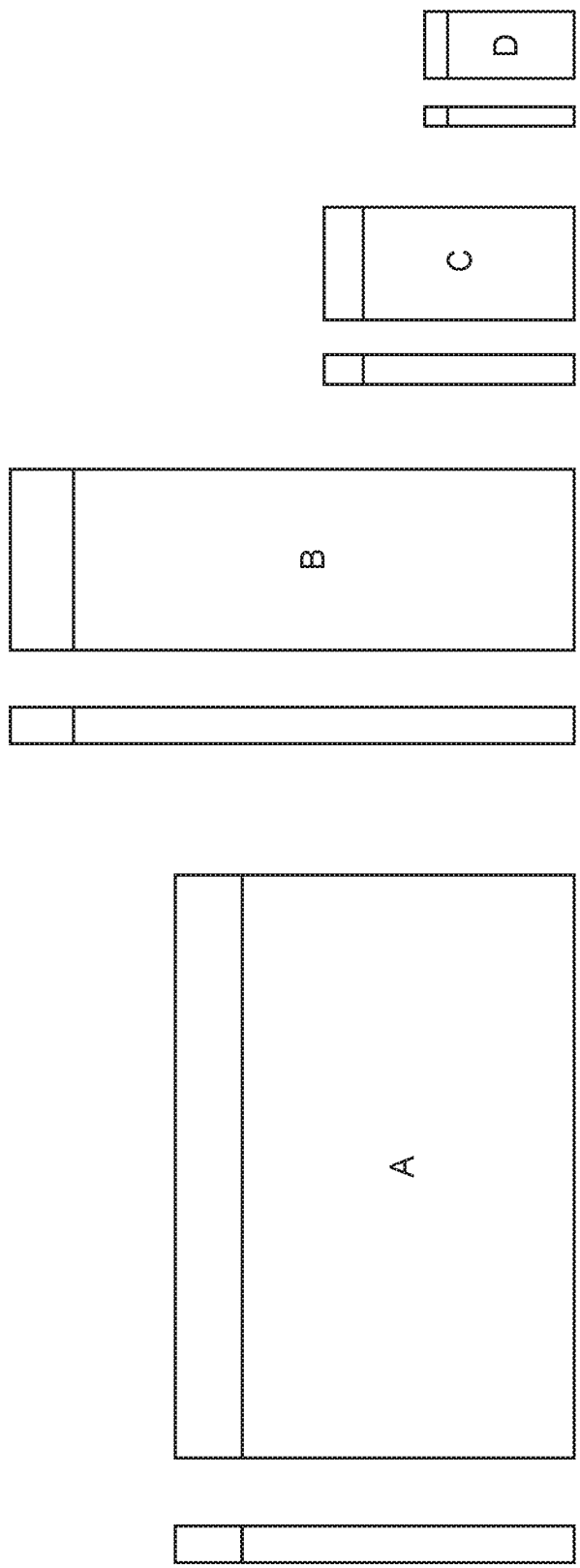

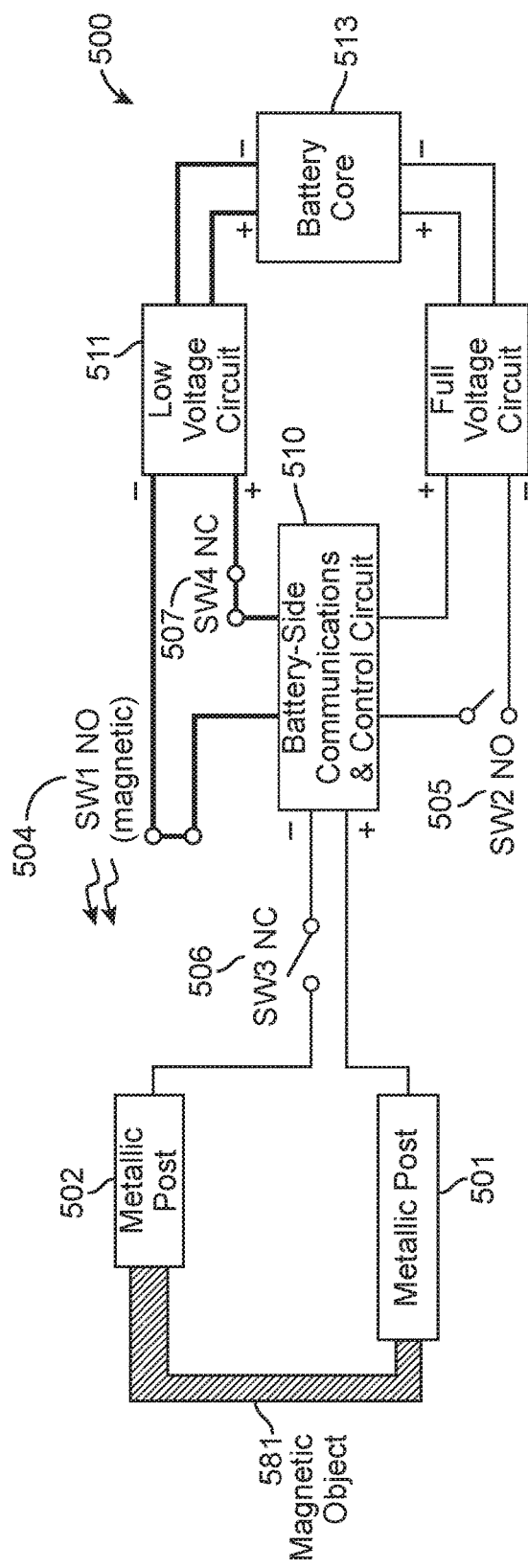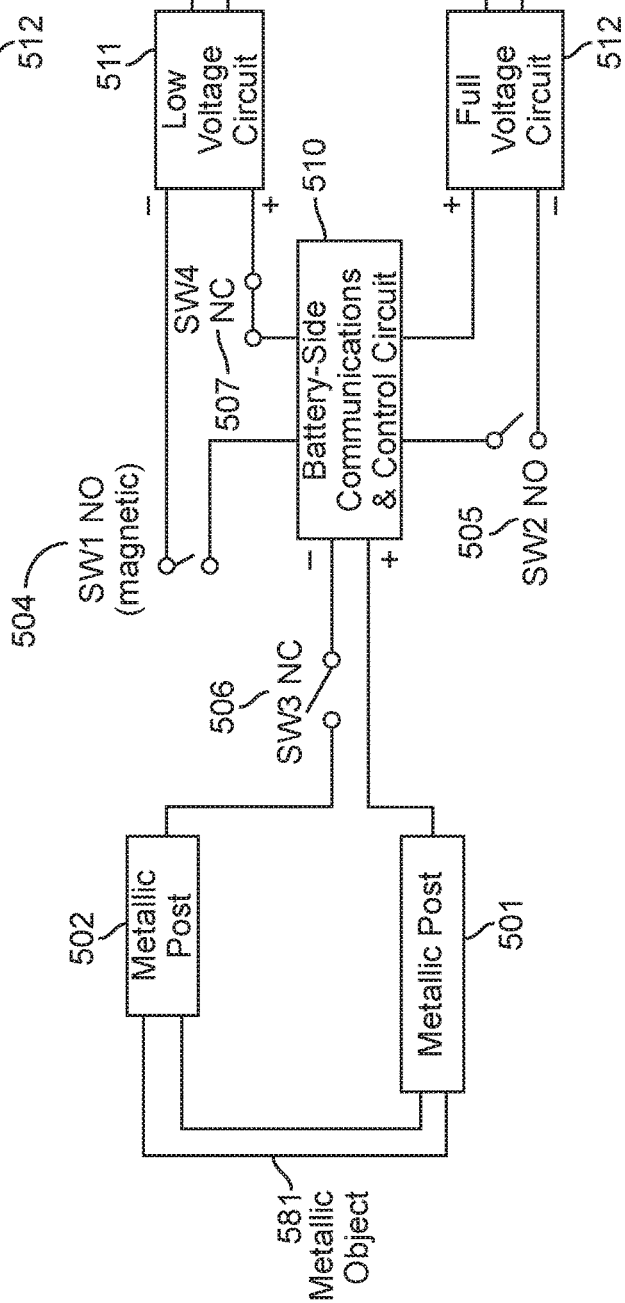
FIG. 5F
FIG. 5G

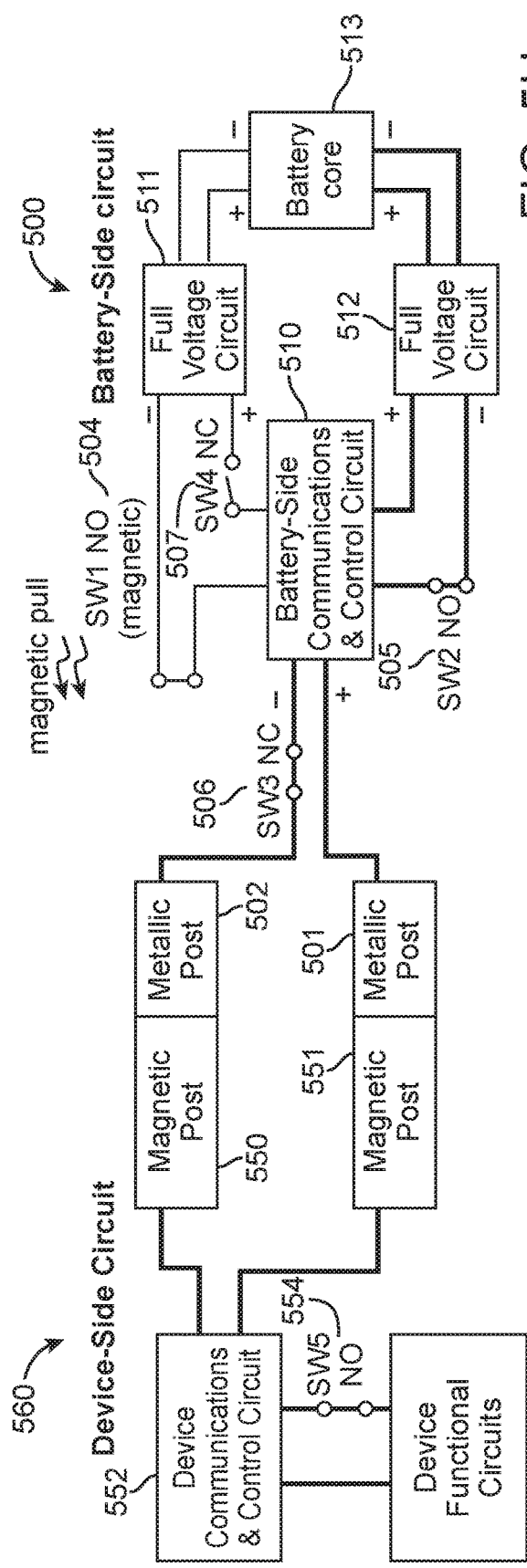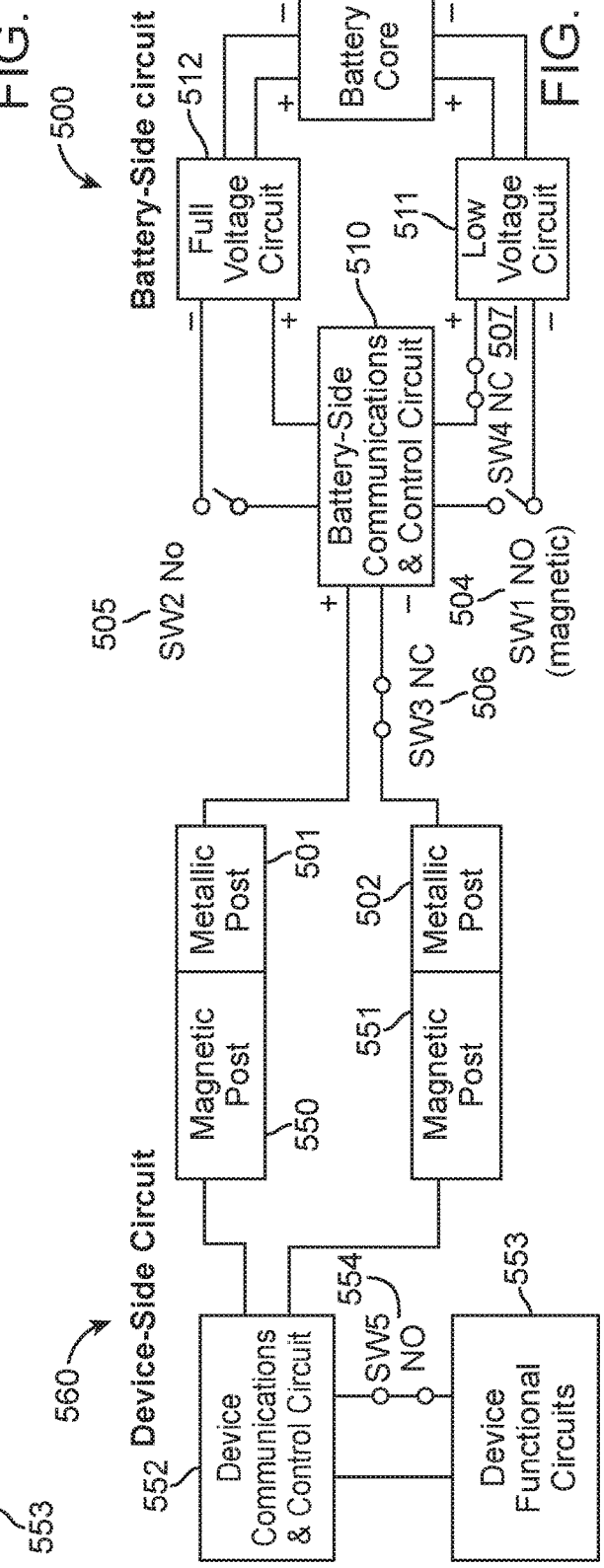
FIG. 5H
FIG. 5I

BATTERY CHARGING SYSTEM AND MOBILE AND ACCESSORY DEVICES

CROSS-REFERENCES TO RELATED APPLICATIONS

This application is a continuation of U.S. patent Ser. No. 13/573,515, filed Sep. 18, 2012, which is a continuation of U.S. patent application Ser. No. 12/715,392, filed Mar. 2, 2010, now U.S. Pat. No. 8,269,453, which is a division of U.S. patent application Ser. No. 11/831,871, filed Jul. 31, 2007, now U.S. Pat. No. 7,671,559, which is incorporated by reference.

BACKGROUND OF THE INVENTION

As the number of small, portable, electronic devices in daily use have multiplied, so too have the need for wireless capabilities. And as computers gain increasing power, so too have the demand to integrate various types of wireless devices with personal computers. However, even as devices have miniaturized and gone wireless, the power requirements of wireless devices have not decreased. On the contrary, in some cases, the power requirements for portable wireless devices laden with new features and processing power have even increased. This trend for increased mobility and power has increased the need for longer lasting re-chargeable batteries and have propelled manufacturers of many new wireless devices to bundle their recharging units and/or batteries with their products.

Modern computers offer a wide variety of methods to communicate with wireless communication and peripheral devices. Wireless networks such as wireless personal area networks (WPAN) for example offer a convenient way for users to connect wireless devices together on a same network with computers. A typical WPAN network can connect wireless devices including devices such as computers, monitors, keyboards, mice, headsets, multimedia devices such as MP3 players, cell phones and camcorders, and PDA's. Standard WPAN networks may be built upon well-known technologies such as IrDA (Infrared Data Association), Bluetooth and UWB (Ultra-wide-band) protocols.

One problem often encountered by a user of a wireless personal area network is the constant need to re-charge or replace the batteries of the wireless devices. Even if the devices are equipped with rechargeable batteries, a user of such a network still needs to be bothered by the tasks of plugging in each device to a power supply or replacing batteries for each device whenever power in the batteries run out. Not only is this inconvenient, but it can also decrease productivity. For example, when wireless device are being charged, the devices may have to be either attached by a cable to a power outlet or may have to be taken out of commission if the batteries are taken out for re-charging. When a critical device such as a wireless mouse or wireless keyboard runs out of power, a user may have to wait until the device is charged being able to use the computer wirelessly again.

Other inconveniences exist. For example, because the power requirements of the various devices are all customized, each device may require its own chargers. Users are forced to deal with a plethora of chargers and/or batteries in managing the power of their plethora of wireless devices. The inconveniences increases the cost using wireless device and reduces workplace productivity.

Despite these inconveniences, the need for wireless peripheral devices is strong. This is especially so for travelers who do not want to deal with bulky equipments or the inconveniences of connecting devices through a tangle of wires and cables. What is required is an apparatus or method that can reduce or help users manage the power requirements of the plethora of wireless devices. It would be helpful to have an apparatus or method that can reduce the time wireless devices are taken out of commission as their batteries are re-charged. It would also be helpful to have an apparatus or method that streamline the process of charging the wide variety and number of batteries used in the plethora of wireless devices.

BRIEF SUMMARY OF THE INVENTION

Various embodiments of the present invention are directed at a method and system for recharging batteries used in wireless electronic devices. According to one embodiment, a rechargeable battery adapted to couple with an electronic device is disclosed. In an exemplary embodiment, the rechargeable battery may include a battery core configured to house battery chemicals, a battery outer shell that fit over and provide physical protection to the battery core, a battery electrical component that can monitor the battery core and that can communicate with a coupled electronic device, and a battery end-cap configured to house the battery electrical component.

In one embodiment, the battery core may be adapted to be swappable with replacement battery cores to increase the capability for recycling. In another embodiment, a rechargeable battery may be adapted to couple with a variety of power charging devices that output power at a variety of parameters and a variety of power consuming devices that require to be provided power at a variety of parameters. In another embodiment, the battery may be adapted to send and receive communications signals with the electronic device to enable battery management functionalities.

For example, according to an embodiment, a rechargeable battery may be adapted to negotiate with the coupled electronic device for an agreed range of power parameters at which power will be transferred to the device and to configure the rechargeable battery to provide power at the agreed range of power parameters. In another embodiment, a rechargeable battery may be adapted to negotiate with the coupled charging device for an agreed range of power parameters at which power will be accepted from the charger and to configure the rechargeable battery to accept power at the agreed range of power parameters.

According to another embodiment, an exemplary rechargeable battery may be coupled to an electronic device with more than one rechargeable batteries. In an embodiment, the rechargeable battery is adapted to coordinate with other rechargeable batteries coupled to the electronic device to negotiate for parameters at which the batteries will be either providing or accepting power. In another embodiment, the electronic device is adapted to negotiate with the plurality of rechargeable batteries to negotiate for parameters at which the batteries will be either providing or accepting power.

According to an embodiment, an exemplary rechargeable battery may include a plurality of sensors to measure a plurality of properties associated with the battery. An exemplary rechargeable battery may, for example, include sensors to measure the temperature and pressure of the battery core in response to power flowing into or out of the battery core as a function of time. A rechargeable battery may include sensors to measure the current and voltage of the battery core in response to power flowing into or out of the battery core. A rechargeable battery may be adapted to monitor and manage the battery core based on the measurements from its plurality of sensors.

According to an embodiment, a rechargeable battery may be adapted to transmit and receive electric power over the same electrical path that the battery transmit and receive communications signals with the coupled electronic device. An exemplary rechargeable battery may include a temporary power storage to store power its communications circuits can access in the event the battery core is drained. A rechargeable battery may be adapted to allow power transmission between the electronic device the battery core only when the electronic device is coupled and to disable power transmission between the electronic device the battery core when the electronic device is not coupled.

According to an embodiment, a rechargeable battery may include a plurality of metallic posts with predetermined dimensions adapted to electrically couple with the electronic device only in certain orientation. In the embodiment, an electrical connection between the battery and the device is properly made only when the rechargeable battery and the electronic device are coupled to each other in a correct configuration. According to an embodiment, a rechargeable battery may also an internal switch that is activated only when an electronic device is detected to be located in close proximity. Without activation of the internal switch, no effective power is allowed to flow into or out of the battery core.

According to a specific embodiment, an exemplary internal switch is activated only in the presence of a magnetic field of a predetermined characteristics. In an embodiment, an electronic device adapted to couple with the exemplary battery may include a magnetic component that emit magnetic fluxes of the right strength and orientation. When an electronic device with the right magnetic signature is brought into close proximity with an exemplary battery, the internal switch is closed and power may be allowed to flow into or out of the battery. If either the strength or orientation of the magnetic flux is off, the internal switch remains inactivated.

According to an embodiment, a rechargeable battery may be adapted to store a charging history. A rechargeable battery may be adapted to reset the charging history when the battery core is replaced. According to an embodiment, based on the histories stored on board, a battery may determine whether the rechargeable battery should undergo a normal charge or reconditioning charge, then configure the battery to undergo a normal charge or reconditioning charge accordingly, and update the charging history as appropriate.

According to another embodiment, a rechargeable battery may be adapted control the charging protocol for any of several goals. In one embodiment, a rechargeable battery may control the rate of charging to minimize charging time. A rechargeable battery may control the rate of charging to maximize overall battery life. A rechargeable battery may control the rate of charging to maximize the energy charged.

According to an embodiment, a rechargeable battery may be adapted to couple with electronic devices through latching mechanisms. According to another embodiment, a rechargeable battery may be adapted to couple with electronic devices through magnetic or electromagnetic-based systems. According to an embodiment, power may be transferred to and from a rechargeable battery through metal contacts. According to another embodiment, power may be transferred to and from a rechargeable battery through inductive means.

An exemplary electronic device adapted to couple to an exemplary rechargeable battery is also disclosed as part of the invention. According to an embodiment, an electronic device may be adapted to negotiate with a rechargeable battery for an agreed range of power to operate. If the electronic device is a power providing device, the device may negotiate for a range of power at which to provide power. If the electronic device is a power consuming device, the device may negotiate for a range of power at which to accept power.

According to an embodiment, an electronic device may also be adapted to couple with and negotiate with more than one rechargeable batteries. An electronic device may negotiate with a plurality of batteries and to configure an independent power parameter at which to output or accept power with each of the batteries. An electronic device may include a small power storage unit to store power that can be used to power an electronic device in the event that power from the batteries are interrupted, which may occur, for example, when one of the batteries becomes drained and/or needs to be replaced.

A host machine is also disclosed as an aspect of the current invention. According to an embodiment, a host machine may be adapted to wireless couple with a plurality of wireless devices, each of which may be coupled to and powered by one or more rechargeable batteries. Over a plurality of wireless links, a host machine may be adapted to communicate with the plurality of wireless devices and to monitor each of the rechargeable batteries coupled to the plurality of wireless devices.

An exemplary host machine may include a plurality of charging slots for charging a plurality of batteries and holding a plurality of batteries in a fully charge state. In an embodiment, when a rechargeable battery becomes drained, a host machine may alert the user of the device with the drained battery and direct the user to a battery of the proper type from its charging slot. An exemplary host machine may be adapted to monitor the plurality of rechargeable batteries held in its charging slots by communicating directly with the charging slots.

According to another embodiment, a host machine may be adapted to identify batteries of unfit quality. A host machine may be adapted to assess the quality state of each of batteries coupled to each of the wireless devices by communicating wirelessly with each of the wireless devices. If a battery of unfit quality is found, the user is directed to a battery of the right type that is also fully charged for the user to swap with the unfit battery.

According to another embodiment, a host machine may be adapted control the charging protocol for any of several goals. In one embodiment, a host machine may control the rate of charging to minimize charging time. A host machine may control the rate of charging to maximize overall battery life. A host machine may control the rate of charging to maximize the energy charged.

An exemplary host machine may be adapted to maintain a record of charging histories for the rechargeable batteries. In an embodiment, based on the charging histories, a host machine may customize the charging protocol for a rechargeable battery. For example, where batteries need to undergo a reconditioning charge periodically after a predetermined numbers of charge cycles, a host machine may determine whether a battery undergoes a normal charge or reconditioning charge based on the record of charging histories for the battery.

According to another embodiment, a host machine may also be adapted to join a network of cooperating remote host machines. In one embodiment, when a host machine joins in a network of cooperating host machines, the host machine may expand the inventory of charged batteries available at its disposal to swap when a battery in one of the wireless devices becomes drained. For example, a host machine alone may only have the batteries in its charging slots at its disposal to offer to swap with a drained battery. After joining a network, when a drained battery appears, a host machine may also query other host machines for batteries compatible with the drained battery to swap with one of its drained batteries.

According to an embodiment, the charging slots on a host machine may couple with rechargeable batteries through latching mechanisms. According to another embodiment, the charging slots on a host machine may couple with rechargeable batteries through magnetic or electromagnetic-based systems. According to an embodiment, power may be transferred to and from the batteries through metal contacts. According to another embodiment, power may be transferred to and from the batteries through inductive means.

An exemplary battery charging and monitoring system is also disclosed as part of the invention. According to an embodiment, a battery charging and monitoring system may include a host machine with a plurality of charging slots and a plurality of wireless devices that can be wirelessly connected to the host machine. Each of the plurality of wireless devices may be powered by one or more rechargeable batteries. The host machine may be adapted to communicate with wireless devices and to monitor charge states of the batteries coupled to the wireless devices through wireless communication links.

According to an embodiment, a battery charging and monitoring system may be adapted to minimize downtime associated with recharging. In an embodiment, a system can keep a plurality of batteries that is always charged and ready for use. When a battery in a wireless device becomes drained, a user may be alerted of the location of the drained battery as well as the location of a charged battery held by the system that is ready to be swapped with the drained battery.

In an embodiment, a battery charging and monitoring system may be configured to estimate the time until each battery coupled to each of the wireless devices will need to be recharged. According to another embodiment, a battery charging and monitoring system may also be adapted to identify batteries of low charge and/or unfit quality. A battery charging and monitoring system may be adapted to assess the charge state and/or quality state of each of batteries coupled to the wireless devices by communicating wirelessly with the wireless devices. A battery charging and monitoring system may also be able to assess the charge state and/or quality state of the batteries that is being held. When a battery of unfit quality is found, the system may help users obtain a new compatible battery through an e-commerce system.

Other embodiments and examples are discussed in the descriptions below. A better understanding of the nature and advantages of the present invention can be gained by reference to the detailed description and the accompanying drawings below.

BRIEF DESCRIPTION OF THE DRAWINGS

FIG. 2G illustrates four exemplary form factors in accordance with a specific embodiment of the invention.

FIG. 5H illustrates the coupling of a battery to an electronic device in a correct exemplary configuration. FIG. 5I illustrates the coupling of a battery to an electronic device in an incorrect exemplary configuration.

DETAILED DESCRIPTION OF THE INVENTION

The present invention relates in general to battery charging and in particular to charging of batteries used in connection with wireless or mobile accessory devices. This section discusses the invention in terms of several exemplary embodiments to better illustrate the invention. The embodiments should not be taken by themselves to unnecessary restrict the scope of the invention.

Figure 1:
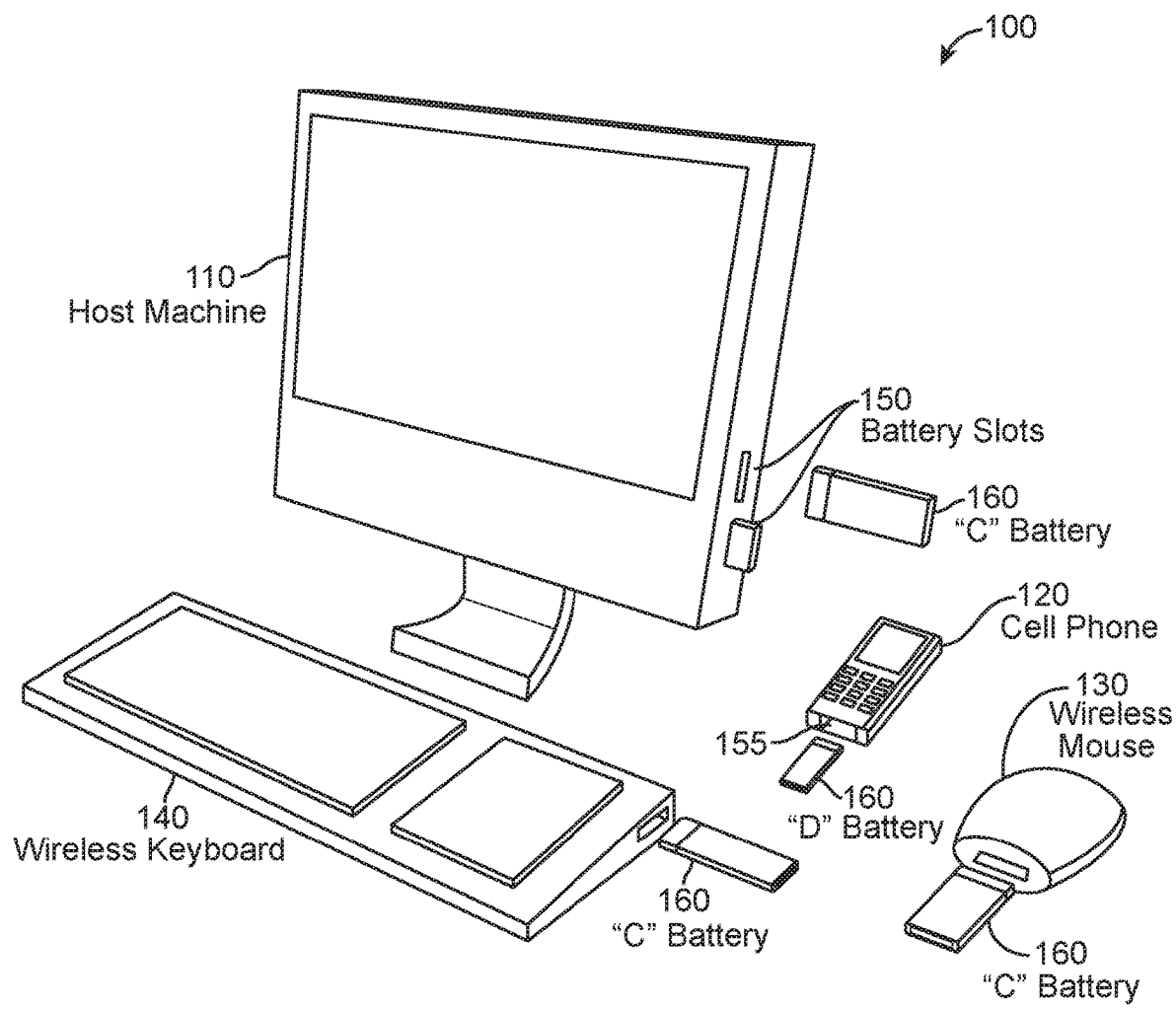
FIG. 1 illustrates an overall battery charging system and mobile and accessory device in accordance with a specific embodiment of the current invention.

FIG. 1 illustrates a battery charging system 100 for mobile and accessory devices in accordance with a specific embodiment of the current invention. An exemplary battery charging system 100 may include host machine 110, plurality of wireless or mobile accessory devices 120, 130, 140, and plurality of rechargeable batteries 160 powering the wireless or mobile accessory devices 120, 130, 140. In an exemplary embodiment, the host machine can be a desktop personal computer, and the wireless or mobile accessory devices can be any of several wireless or mobile devices proximally located to the desktop personal computer and adapted to communicate wirelessly with the desktop personal computer.

Examples of wireless or mobile accessory devices include mice, keyboards, speakers, mp3 players, personal digital assistants, cell phones, laptop computers, microphones, headphones, and headsets. In another exemplary embodiment, the host machine can be a laptop computer and the wireless or mobile accessory devices can be any of wireless or mobile devices proximally located to the laptop computer and adapted to communicate wirelessly with the laptop computer.

In an exemplary embodiment, the host machines can act as power charging devices while the wireless or mobile accessory devices can act as power consuming devices. As shown in FIG. 1, batteries can be adapted to couple to power charging devices such as host machines through coupling mechanisms labeled as charging slots 150 in FIG. 1. Similarly, batteries can couple to power consuming devices such as mobile or wireless devices through coupling mechanisms labeled as battery coupling components 155 in FIG. 1. In an embodiment, host machines can be both power consuming devices as well as power charging devices. In a further embodiment, the charging slots and the coupling components may be the same components.

An example where a host machine can be both a power consuming device as well as power charging device is a laptop computer. In an embodiment, a laptop host machine may be both a power charging and power consuming device that can enter either a power charging mode of operation or a power consumption mode of operation. When plugged into an external power, the laptop may enter into the power charging mode wherein the host machine is adapted to charge a plurality of batteries coupled to its battery charging slots. These batteries may later be used to provide power to either the accessory devices of the laptop or the laptop itself.

When unplugged from an external power supply, the laptop may enter into power consuming mode and begin to consume power from some of the batteries coupled to its battery charging slots. In an embodiment, while unplugged, instead of continuing to provide power to recharge batteries for the accessory devices, the laptop may, to conserve power, terminate delivering power to charge the batteries for the accessory devices. The laptop may return to charging batteries for accessory devices when the laptop is plugged back to an external power supply.

To decrease the potential downtime that a user may face as a result of waiting for rechargeable batteries to charge, another aspect of the invention envisions host machines with recharging slots that are adapted to hold in standby a plurality of rechargeable batteries that are fully charged. Since all batteries take time to recharge, it is convenient for the host machines to maintain a plurality of excess, fully charged batteries in standby that can be easily swapped with drained batteries once a drained battery is detected.

According to another aspect of the current invention, charging slots 150 of power charging devices such as host machines 110 may be adapted to charge a variety of types of rechargeable batteries. According to another aspect of the current invention, a variety of types of rechargeable batteries may be adapted to power a large diversity of power consuming devices. In an embodiment, a type of battery may specify a unique physical form factor. In another embodiment, a type may specify a range of power parameters at which the battery can accept power. In another embodiment, a type may specify a range of power parameters at which the battery can output power. In yet another embodiment, a type may specify the energy capacity of a battery.

Figure 2A:
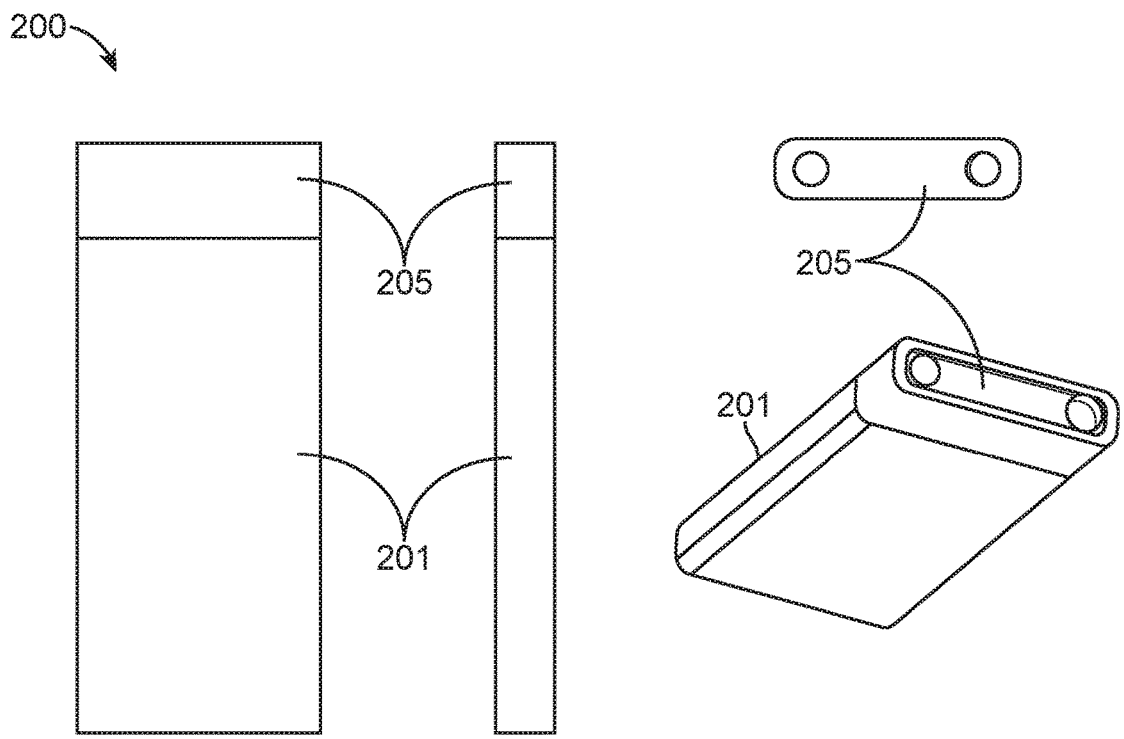
FIG. 2A shows various perspectives of the physical form factor of an exemplary rechargeable battery.

FIG. 2A shows various perspectives of an exemplary physical form factor of rechargeable battery 200. In an embodiment, the overall physical form factor is of a flat type that is adapted to conveniently couple with a large variety of electronic devices. From the outside, the exemplary battery comprises at least two visible parts, battery shell 201 and battery end cap 205. In an embodiment, battery shell 201 can be made of either recyclable plastic or metal.

In another embodiment, battery shell 201 can be made of anodized aluminum similar to the material used in the Apple iPod Shuffle. In an embodiment, end cap 205 may be further adapted to be removed to facilitate the replacement of the battery core 202 inside the battery. Depending on the embodiment, end cap 205 may be adapted to be removed by an end user directly or by specially designated recyclers. In a further embodiment, the end cap can be removed by users directly with specially provided tools.

Figure 2B:
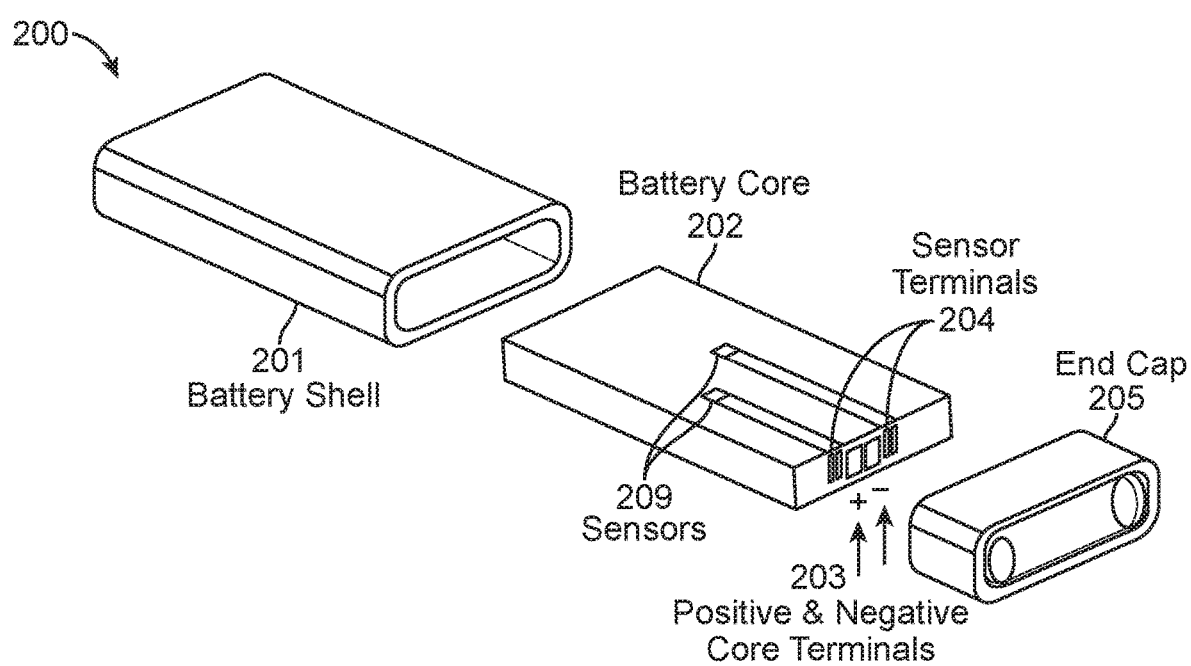
FIG. 2B shows a perspective view of the major components of an exemplary rechargeable battery.

FIG. 2B shows a perspective view of components of a rechargeable battery as envisioned under an embodiment of the current invention. Illustrated are battery shell 201, battery core 202, terminals for conducting power 203, sensor terminals 204, and end cap 205 that fits over a portion of battery core 202 and battery shell 201. In an embodiment, battery core 202 can be made of lithium polymer. The battery core can further be contained in a bag made of a material such as Mylar.

Figure 2C:
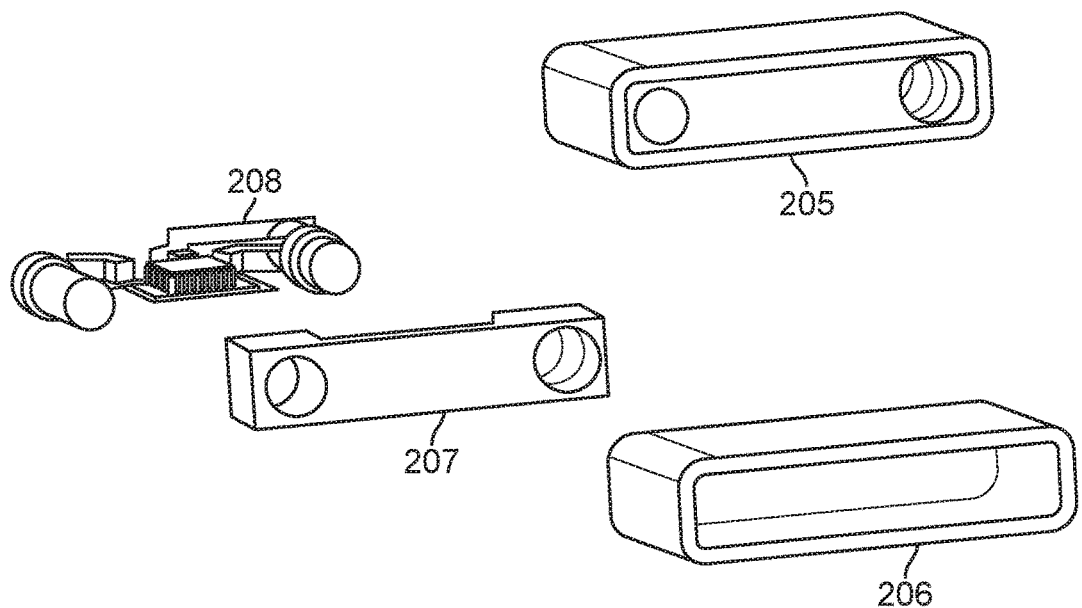
FIG. 2C illustrates a detailed subcomponent view associated with the end cap of an exemplary rechargeable battery.

FIG. 2C illustrates a few of the subcomponent that may be associated with battery end cap 205 in accordance with an embodiment of the invention. As FIG. 2C illustrates, end cap 205 may comprise end cap shell 206, end cap internal structure 207, and battery electrical component 208. In a specific embodiment, battery shell 201, battery core 202, and end cap components 206 and 207 can all be designed to help isolate electrical component 208 from battery shell 201. Properly isolated, in an embodiment, battery shell 201 and end cap 205 may be made of metallic materials.

In an embodiment, battery electrical component 208 may be adapted to carry out a variety of battery management functions including monitoring the various measurements of the battery properties. According to an embodiment, the battery properties measured for battery management purposes may include measurements such as the temperature and pressure and the current and voltage response of a battery in reaction to a power load.

Depending on the specific embodiments, battery management may mean different things. For example, in an embodiment, the rate at which power may be drawn from a battery may be managed. In another embodiment, the extent to which a battery may be drained may be managed. Both the rate and the extent of discharge may need to be managed depending on, for example, whether the user wants to maximize the life expectancies of those batteries, maximize power available for an application, or minimize the battery weight for a device.

According to an embodiment, battery management may also include the evaluation of the quality state of the battery core. For example, the evaluation can include an assessment of when a battery core might need to be replaced. According to another embodiment, battery management also includes an assessment of the charge state of the battery core. For example, the evaluation can include an assessment of when a battery needs to be recharged. According to an embodiment, battery management may be customized by type, brand or even make of battery cores. The management process may be implemented by software. In a further embodiment, the software may be customizable by user preferences or may also be updateable through software patches from the manufacturer.

In an embodiment, battery electrical component 208 may be adapted to assess the quality state or the charge state of battery core 202 based on the charging history of a battery. According to a specific embodiment, where a battery core has a predetermined expected life time, electrical component 208 of a battery may be adapted to assess the quality of the battery core by tracking the number of charge/discharge cycles of the battery core. In the embodiment, after a predetermined number of charge/discharge cycles, the battery may be adapted to send a signal alerting of the need to replace the battery core. Electrical component 208 may also be adapted to implement more complicated algorithms. For example, battery electrical component 208 may also be adapted to store and keep track of the historical measurements of various battery properties.

In a further embodiment, assessments based on charging histories may be enhance. For example, instead of just counting the number of charge and discharge cycles, electrical component 208 may be adapted to also distinguish between the number of slow and the number of fast charges. The charging histories may also be used to augment the interpretation of property measurements. For example in an embodiment, if the temperature and pressure gain for a given amount of charge or discharge for a battery core has been, for example, increasing with more recent charge cycles, electrical component 208 may normalize recent measurements against the recent increases. Alternatively, the recent trends may in itself be used to infer a charge state or quality state of the battery. Other measurements and inferences may be made. For example, in another embodiment, the measurements of the current and voltage responses may be used to help assess whether a reconditioning need to be performed.

Another aspect of the invention relates to the location where battery management decisions are made. In general, according to one embodiment, a host machine, an accessory device, or an intelligent rechargeable battery may be adapted to conduct battery management functionalities. In a specific embodiment where the host machine implements battery management, a host machine may be adapted to identify a battery by an id and to store the battery charging histories by the id. In an embodiment where an accessory device is adapted to manage the process, the accessory may be adapted to identify a battery by an id and to store the battery charging histories by the id. In an embodiment where the battery is adapted to manage the process, the battery may be adapted to store its own local copies of charging histories. Battery functionality may also involve any combination of the entities described in the above embodiments. For example, a host machine, an accessory device, and an intelligent rechargeable battery may all participate in part of the battery management process. The specific roles each will play will depend on the specific embodiment.

When the management process is carried out by the battery, electronic circuit 210 on the battery may be adapted to coordinate the battery management process. For example, if the battery determines that its core needs to be replaced, it may signal the host machine or accessory device to which the battery is coupled that the battery needs to be replaced. In embodiment, a host machine or accessory device may be adapted to alert the user especially if a host machine or accessory device is better equipped than a battery to alert a user. Where the host machine is best positioned to alert a user, when an accessory device is notified that a battery needs to be recharged, the device may preferably relay the message to a host machine. When a host machine is informed that a battery needs to be replaced, the host machine may then inform the user of the problem. In a specific embodiment, the host machine may also guide the user to obtain a replacement.

Another aspect of the current invention relates to recycling. In an embodiment, battery core 202 may be adapted to be replaced while the rest of the batteries, including the battery shell, terminals for conducting power 203, terminal sensors 204, and end cap 205, are reused. In an embodiment, the lifetime of a battery may be designed to be several times longer than a battery core. In a specific embodiment, battery end cap 205 can be adapted to allow battery core 202 to be accessed for replacement.

When the time comes finally for the rest of the battery to be disposed, each of the components including battery shell 201, battery core 202, terminals for conducting power 203, sensor terminals 204, and end cap 205 may be adapted to be recycled so as to minimize environment impact of disposing rechargeable battery 200. In the embodiment, the invention may also include methods for assessing whether a battery core needs to be replaced. In an embodiment, the assessment of whether to replace the core or to replace the entire battery may be based partly by monitoring measurements of battery properties. In a further embodiment, the assessments may be based also on the number of charge/discharge cycles the core has undergone.

In general, according to an embodiment, the battery may be serviced by the user, by the manufacturer or a designated service center. Where a battery is serviced, either by the manufacturer or by the user, battery electrical component 208 is preferably adapted to detect the servicing, such as the swapping of the battery core, and to reinitialize or reset the electrical component. According to one embodiment, the electrical component may need to be re-initialized because it is configured with settings and parameters customized for a specific type, model, or manufacturer of a battery core. When the battery core is replaced, those settings and parameters need to be reset.

In another embodiment, the electrical component may also have been adapted to store the charging histories for a battery core. When the battery core is replaced, those records also need to be reset. In some embodiments, information such as charging histories may be stored off the battery, such as on host machines. In those embodiments, the battery may be adapted to send a signal to the host machines for the host machines to rest and re-initialize the appropriate records and settings as appropriate.

Figure 2D:
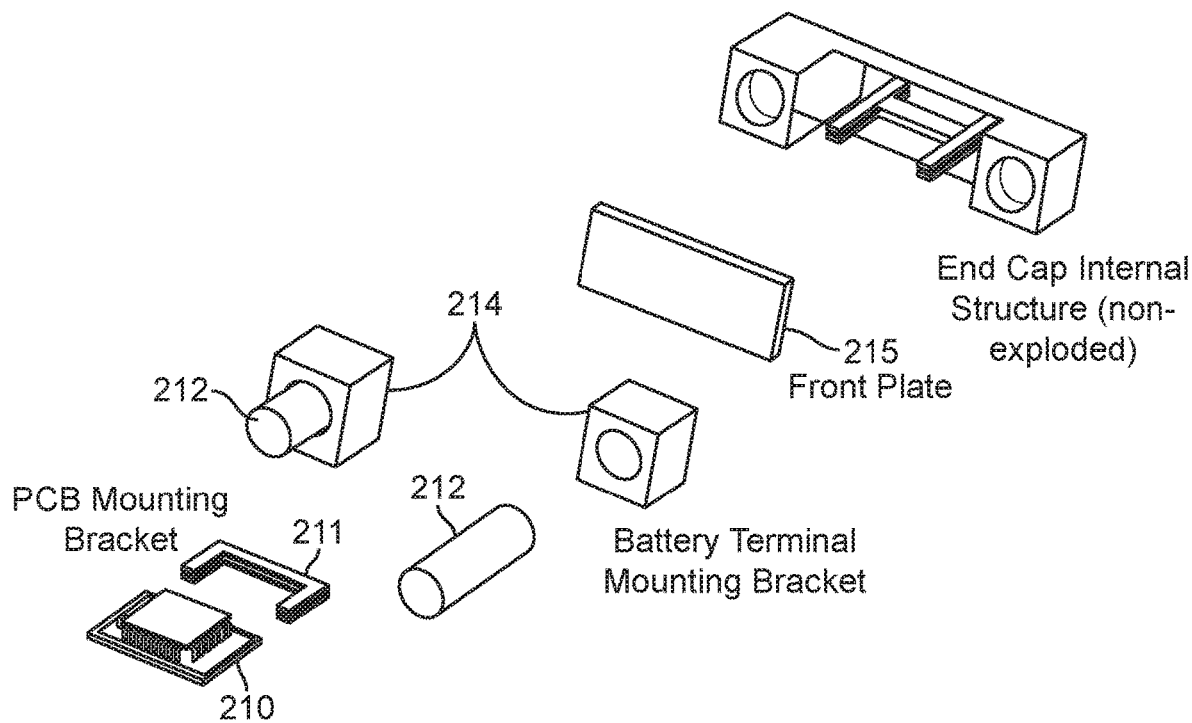
FIG. 2D illustrates an additional details making up the electrical component of an exemplary rechargeable battery.

FIG. 2D illustrates additional details making up the battery electrical component 208 of an exemplary battery. In the embodiment, battery electrical component may comprise an electronic circuit 210, a mount bracket 211 for electronic circuit 210, and a variety of accessories, including electric terminals 212, terminal mounting brackets 214, and terminal front plate 215. In an embodiment, mount bracket 211 may be adapted to hold circuit board 210 of electrical component 208 inside battery end cap 205. Circuit board 210 may be inserted and removed via simple friction fit. In one embodiment, electrical component 208 may be run by software or firmware that may be customized by a user. In a further embodiment, the software or firmware may also be updated by running a software patch from the manufacturer.

In an embodiment, terminal mounting brackets 214 may use a friction fit to retain battery terminal posts 212. Front plate 215 may be adapted to tie terminal mounting brackets 214 together and to provide an attachment surface for mounting bracket 211. In an embodiment, end cap 205 may be formed of a plastic material, where end cap components 206 and 207 and end cap 205 may be injection molded as a single piece of recyclable plastic. In another embodiment, end cap 205 may be formed of a metallic material, where end cap components 206 and 207 may be injection molded as a component and be attached to end cap 205 via friction fit.

Figure 2E:
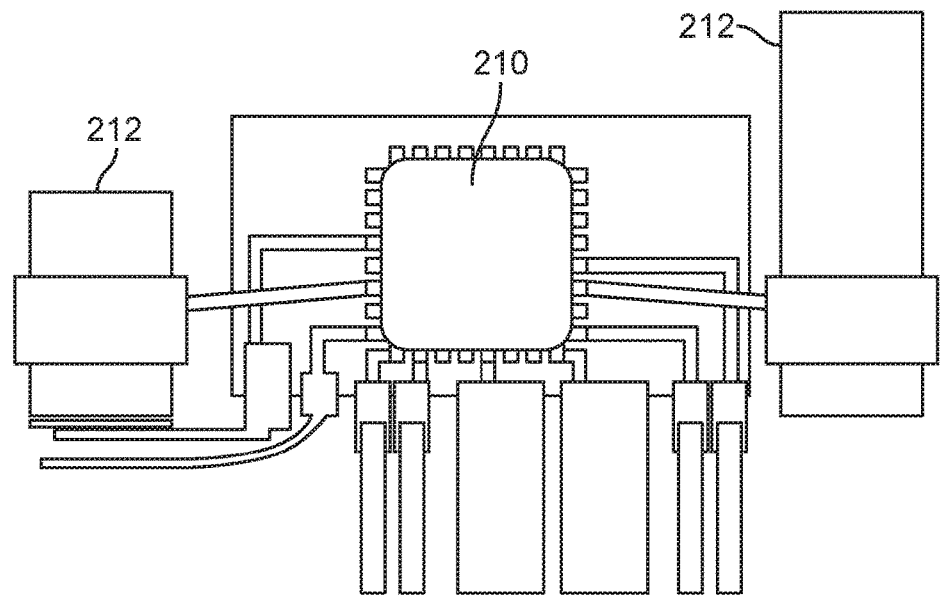
FIG. 2E illustrates a close up view of the electrical components of an exemplary battery.
Figure 2F:
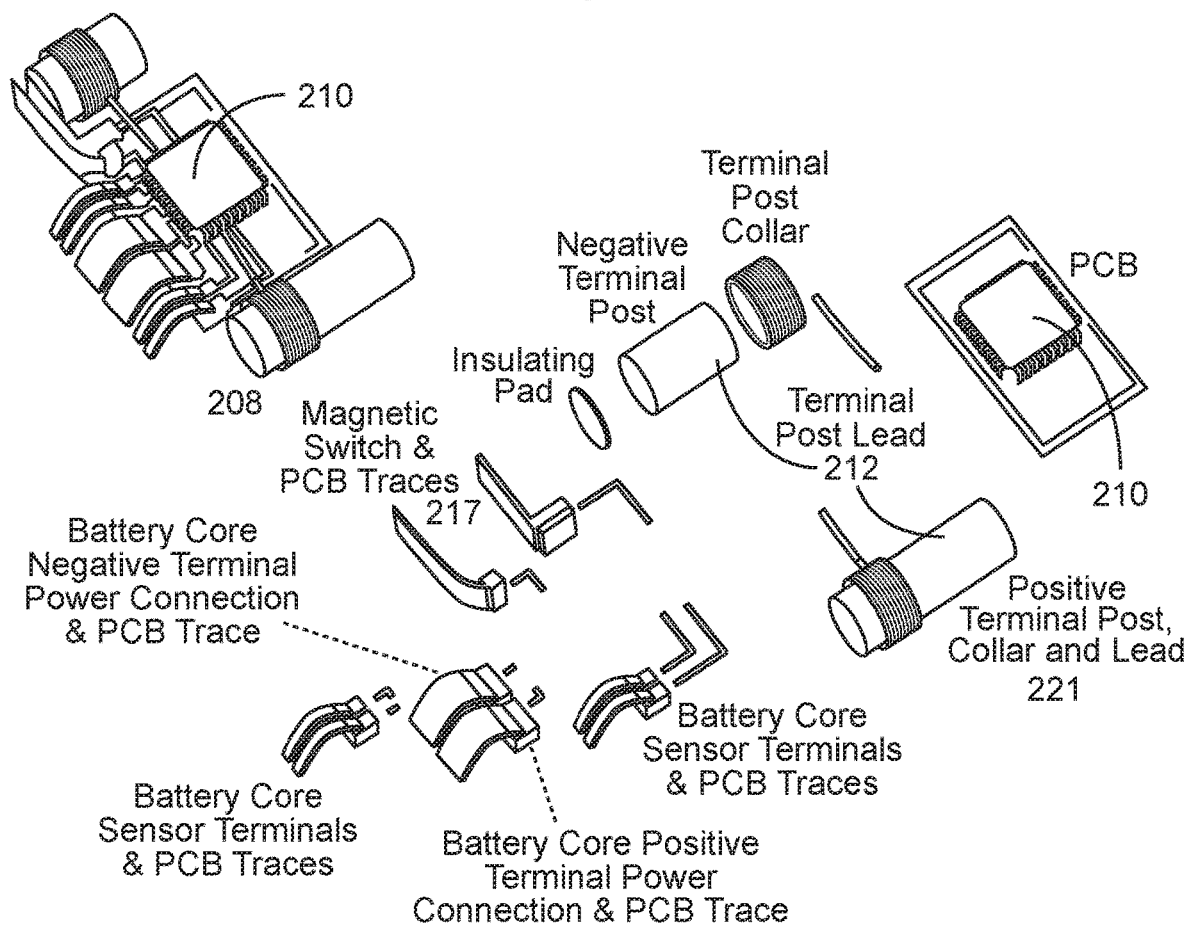
FIG. 2F illustrates a perspective view of the electrical components of an exemplary battery.

FIGS. 2E and 2F illustrate a more detailed illustration of electrical components in a specific embodiment of the current invention. As FIG. 2F illustrates, besides electronic circuit 210 and components for conducting power, electrical component 208 may also include magnetic Switch 217 that prevents effective power transmission to and from the battery core in the absence of a magnetic field. In the embodiment, magnetic Switch 217 may be configured to close in the presence of a magnetic field above a predetermined threshold of magnetic strength. In another embodiment, magnetic Switch 217 may be configured to close based on some other unique characteristics of the magnetic fields. For example, a switch could be configured to close only in a magnetic field with fluxes of a threshold strength and fluxes at a predetermined orientation.

Another aspect of the current invention relates to the concept of a "universal battery" where a few "types" of batteries are adapted to be coupled with a large variety of electronic devices. In one embodiment, the battery may be adapted to be charged at a range of power parameters. In another embodiment, the battery may be adapted to power devices at a range of power parameters. In one embodiment, when a battery is coupled to a power consuming device, electrical component 208 may be adapted to negotiate with the electronic device for power settings at which to output power. In the embodiment, electrical component 208 is preferably adapted to configure the battery to provide for power at the agreed power settings.

In another embodiment, when a battery is coupled to a power charging device, electrical component 208 may be adapted to negotiate with the charging device for power settings at which the battery will accept power. In the embodiment, electrical component 208 is preferably adapted to configure the battery accept power at the agreed power settings. Therefore, in an embodiment, a "type" may specify a specific range of power parameters at which a battery is adapted to be charged. In another embodiment, a "type" may specify a specific range of power parameters at which a battery is adapted to output power. In another embodiment, a "type" may also specify the maximum energy capacity of a battery.

According to an embodiment, a specific "type" of a universal battery may also specify a physical form factor. FIG. 2G shows four exemplary form factors—labeled to as Class A, Class B, Class C, and Class D—of an exemplary universal battery. According to one embodiment, all universal battery types feature a flat form factor adapted to conveniently couple with a large variety of electronic devices.

A large form factor such as Class A may be adapted to couple with large mobile devices such as laptops. A medium form factor such as Class B and Class C may be adapted to couple with medium mobile or wireless devices such as cell phones, mp3 players, wireless keyboards, mice and game controllers, personal digital assistants, smart phones, larger wireless audiophile-type headphones. A small form factor such as Class D may be adapted to couple with smaller mobile or wireless devices such as mice, watches, RFID devices, and small sport-type headphones.

In an embodiment, the energy storage capacities of the rechargeable batteries may or may not correlate with the type of a battery's physical form factor. Similarly, the power ranges at which the rechargeable batteries may be adapted to operate may or may not correlate with the type of its physical form factor. In one embodiment, batteries of all physical form factors feature the same range of power parameters. In another embodiment, each form factor offer specified ranges of energy storage capacities and range of power parameters. For example, according to an embodiment, Class A universal batteries may have a width of around 6.5", height of around 4.8" and thickness of around 0.4". The batteries may also possess an energy storage of around 100 watt hours and may be adapted to accept power at up to 18 volts and 600 mA and output power at up to 14 volts and 500 mA.

Similarly, Class B universal may have a width of around 2", height of around 6.8", and thickness of around 0.5" and may possess an energy storage of around 50 watt hour. Class C universal batteries may have a width of around 0.25", height of around 3" and thickness of around 3" and may possess an energy storage capacity of around 20 watt hour. Class D universal batteries may have a width of around 0.75", height of around 1.8" and thickness of around 0.2" and may possess an energy storage capacity of around 0.02 watt hour.

Figure 3A:
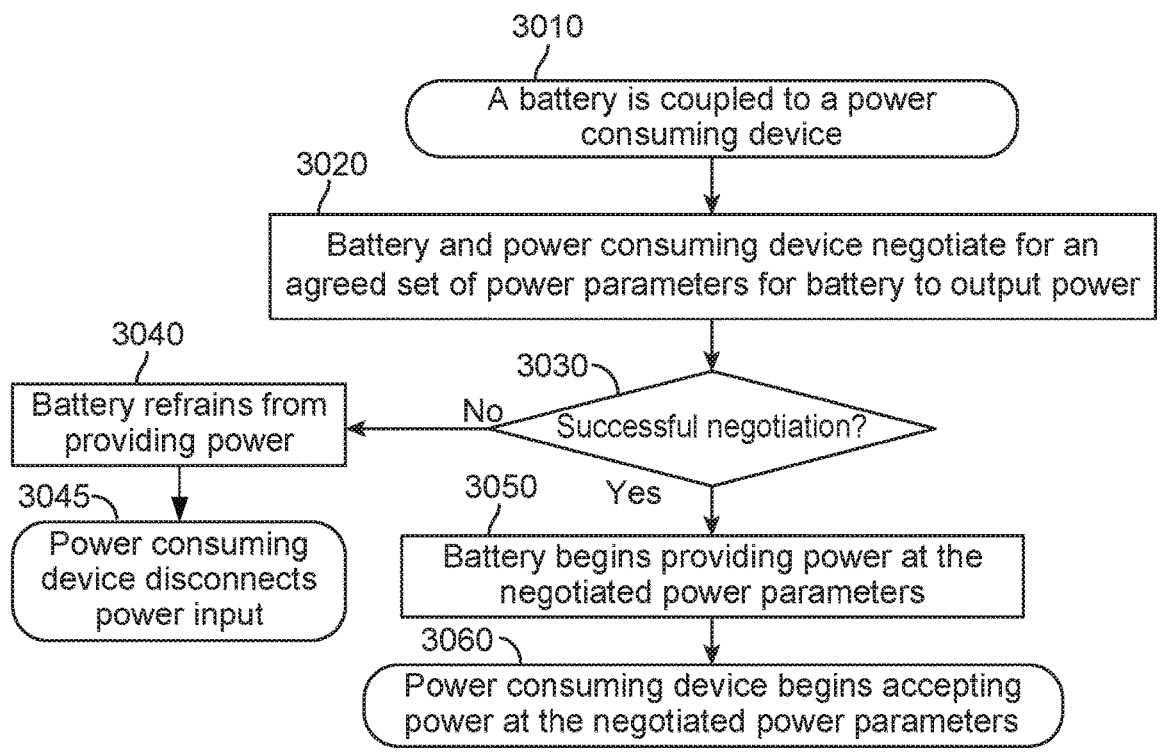
FIG. 3A shows an exemplary process through which a universal battery may negotiate with and provide power to a power consuming device.

FIG. 3A shows an exemplary process through which a universal battery may be adapted to negotiate with and provide power to a power consuming device. In step 3010, the universal battery is coupled to a power consuming device. In step 3020, the universal battery attempts to negotiate with the power consuming device for a power parameter for the battery to output power. If the power consuming device is adapted to only accept power at a single fixed power parameter, the universal battery will ascertain that power parameter. If the universal battery can provide power at the required power parameter, the battery sends an acknowledgement in response to the power consuming device. If the power consuming device is adapted to accept power at a range of power parameters, the device and the battery may negotiate at step 3020 for a specific power parameter that is amenable to both according to the current embodiment.

Figure 3B:
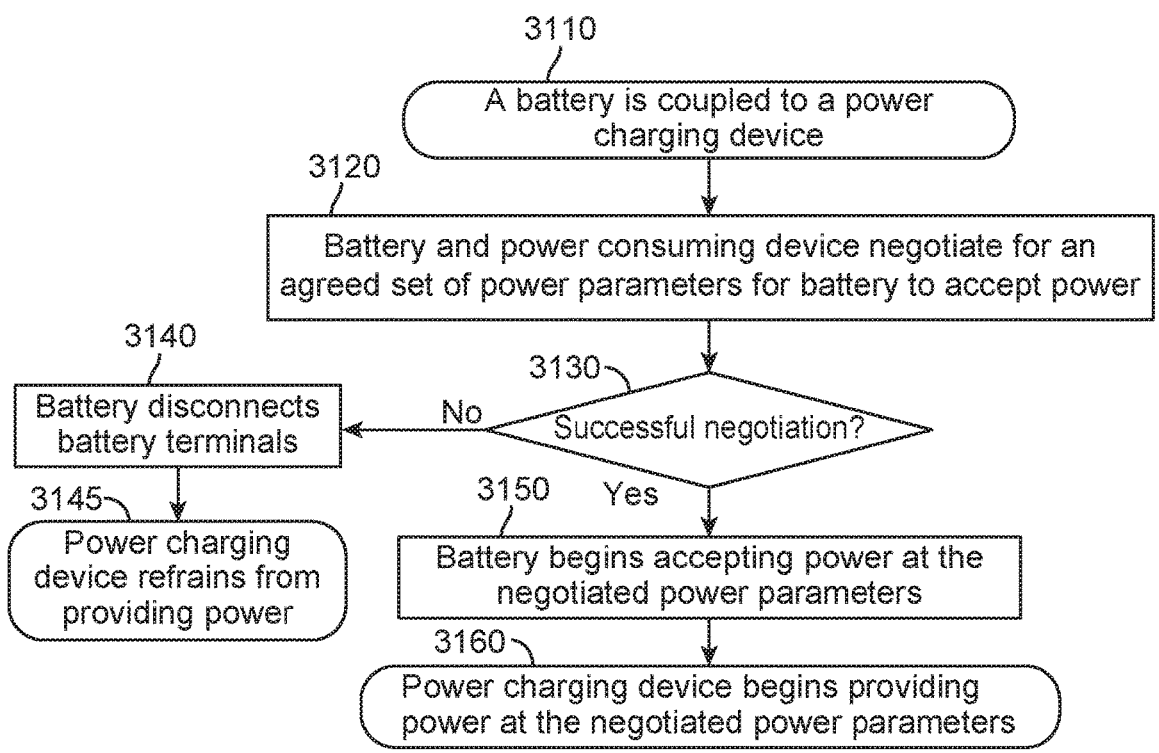
FIG. 3B shows an exemplary process through which a universal battery may negotiate with and accept power from a power charging device.

Once a specific power output parameter is agreed upon, an explicit acknowledgement from both the battery and the device may also be sent. After the agreement, the battery may begin delivering power at the agreed power parameter at 3050, and the power consuming device may begin accepting power at the agreed power parameters at 3060. For a variety of reasons, such as if the power consuming device requires power to be outputted at a range outside of the range of the battery, the negotiations process may fail. If the negotiations fail, the battery may refrain from providing power at 3040, and the power consuming device may also take the precautionary step of refraining to accept power at step 3045.

Where a battery is coupled to a power charging device, an analogous process may be followed. FIG. 3B shows an exemplary process through which a universal battery may be adapted to negotiate with and accept power from a power charging device. In step 3110, the universal battery is coupled to a power charging device. In step 3120, the universal battery attempts to negotiate with the power charging device for a power parameter at which to accept power. If the power charging device is adapted to provide power only at a single fixed power parameter, that power parameter may be communicated to the battery. If the universal battery can accept power at the required power parameter, the battery sends an acknowledgement in response. If the power charging device is adapted to provide power at a range of power parameters, the device and the battery will negotiate at step 3120 for a specific power parameter that is amenable to both.

Once a specific power parameter is agreed, the battery may begin accepting power at the agreed power parameter at 3150. Similarly, the power charging device may also begin configuration to begin providing power at the agreed power parameters at 3160. For a variety of reasons, such as if the battery requires power to be provided at a range outside of the range of the power charging device, the negotiations process fails. If negotiations fail, the battery may refrain from accepting power at step 3140, and the power charging device may also refrain from providing power at 3045.

Figure 3C:
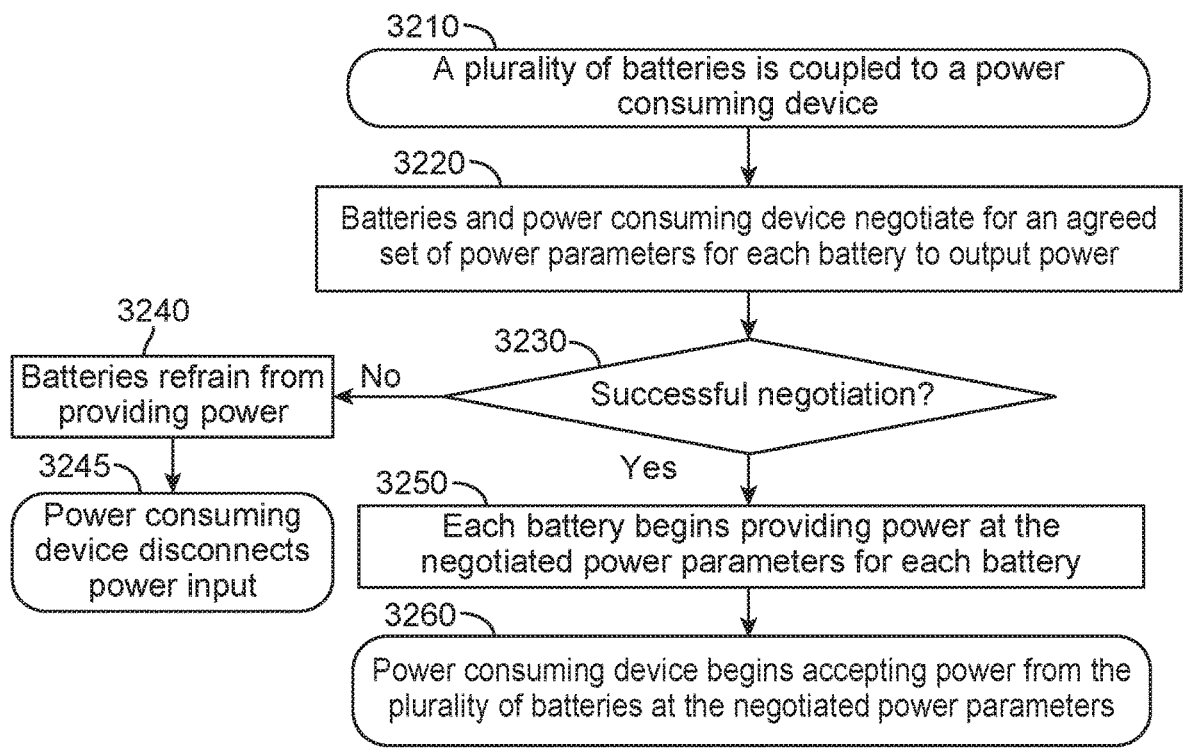
FIG. 3C illustrates an embodiment of the steps a group of universal batteries may take in coupling with a power consuming device.
Figure 3D:
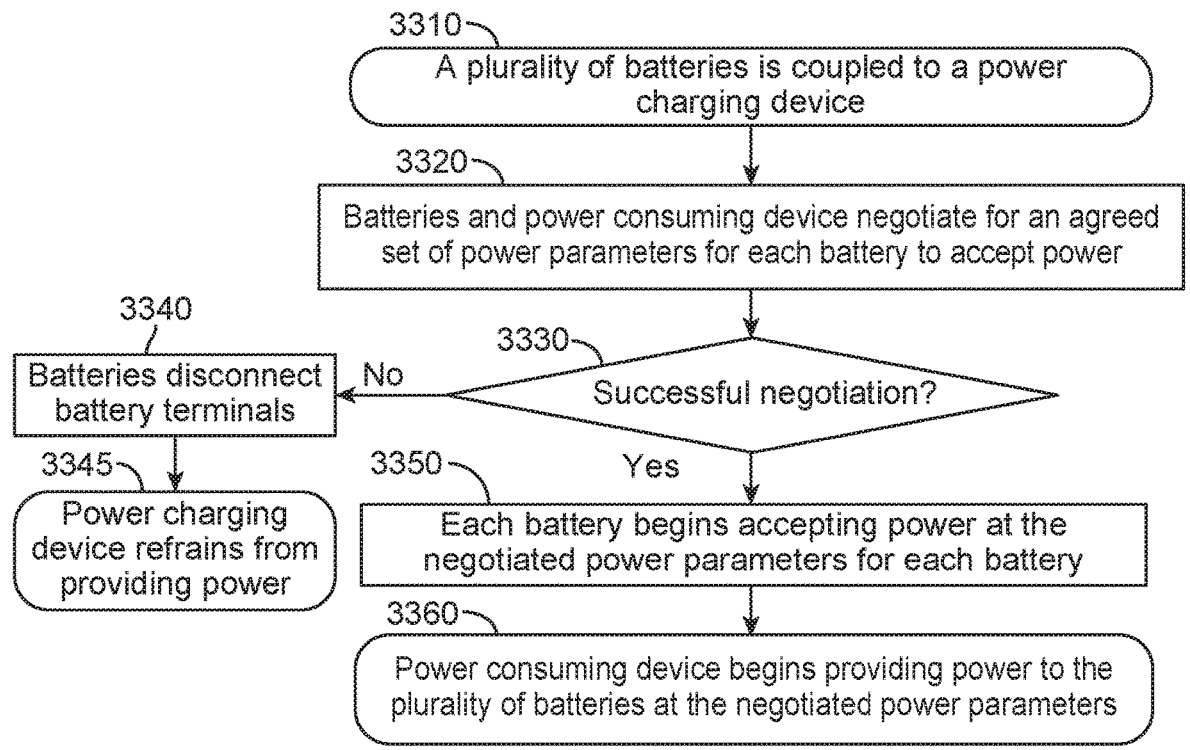
FIG. 3D shows an embodiment of the steps a group universal batteries may take in coupling with a power charging device.

According to an embodiment, it may sometimes be convenient for a plurality of universal batteries to couple with a power consuming device or a power charging device. FIG. 3C shows an exemplary process through which a plurality of universal batteries may negotiate with and provide power to a power consuming device. FIG. 3D shows an exemplary process through which a plurality of universal batteries may negotiate with and accept power from a power charging device. For the most parts, the steps in FIGS. 3C and 3D are analogous to the steps shown in FIGS. 3A and 3B though some differences do exist. For example, in FIG. 3C, steps 3220, 3250, and 3260 may be different from steps 3020, 3050, and 3060 of FIG. 3A. Similarly, in FIG. 3D, steps 3320, 3350, and 3360 may also be different from steps 3120, 3150, and 3160 in FIG. 3B.

Where a plurality of batteries are involved, according to an embodiment, the plurality of batteries may negotiate at step 3220 or 3320, with the electronic device as a group. In an embodiment, the negotiations may be explicitly carried out by a coordinating battery and the power consuming device. For example, the plurality of batteries may first negotiate amongst themselves to designate a coordinating battery. The coordinating battery then negotiates with the power consuming device on behalf of the other batteries for power parameters at which each will output and/or accept power.

According to an alternative embodiment, the plurality of batteries may negotiate at step 3220 or 3320, with the electronic device independently between each of the batteries and the electronic device. In an embodiment, when a battery is coupled to an electronic device, the battery and the electronic device will proceed to negotiate with each other independently of any of the other of the plurality of batteries coupled to or that might be coupled to the device.

Irrespective of whether the negotiations is accomplished collectively (such as through a coordinating battery) or individually (such as that carried out independently), the power requirements under which each of the plurality of batteries agrees to operate may or may not be the same. Also, depending on the actual parameters negotiated, the electronic device may connect the batteries in parallel or in series.

In an embodiment with two batteries, two batteries configured to output the same voltage may be connected in parallel. Two batteries configured to output the same current may be connected in series, according to another embodiment. In an embodiment involving three batteries, two of the batteries may be connected in series while a third in parallel in one embodiment. According to another embodiment, all three may be connected in series. According to yet another embodiment, all three batteries may be connected in parallel also.

According to a specific embodiment involving two batteries, when two exemplary universal batteries rated for 0-3 volts and 0-500 mA are coupled to an exemplary power consuming device that requires 3 volts and 400 mA, the power consuming device may negotiate for one of the batteries to output power at 3 volts and 300 mA and the other to output power at 3 volts and 100 mA. In the embodiment, the power consuming device would connect the two batteries in parallel, wherein the batteries in the parallel combination would give rise to a total power output of 3 volts and 400 mA.

In another embodiment, the power consuming device would connect the two batteries in parallel and negotiate for both of the batteries to output power at 3 volts and 200 mA, giving rise to the same total power output of 3 volts and 400 mA. In yet another embodiment, the power consuming device may connect the two batteries in series and negotiate to have one batteries output power at 2 volts and 400 mA and the other at 1 volt and 400 mA, giving rise to the same total power output of 3 volts and 400 mA. In another embodiment, the power consuming device may connect the two batteries in series and negotiate to have both of the batteries output power at 1.5 volts and 400 mA, giving rise to the same total power output of 3 volts and 400 mA.

In yet another embodiment, the power consuming device may only connect one of the two batteries and negotiate to one output power at 3 volts and 400 mA, with the other disconnected and serving as a backup. In the embodiment, when the one battery becomes drained, a user may be notified to replace the battery while the second or backup battery may be connected and configure to output power at 3 volts and 400 mA. Many other possibilities exist, with similar analogous embodiments applying also for coupling with power charging devices.

In general, in embodiments such as those illustrated in FIGS. 3A, 3B, 3C, and 3D, each battery may negotiate for power parameters based on one of several constraints or goals. For example, when a battery is coupled to a power consuming device, the negotiations may be adapted to drain energy from the battery in constrained ways to help lengthen the time needed until the next recharge. In some battery types, for a fixed power requirement, outputting power at a threshold voltage or threshold current may help to also lengthen overall battery life.

If multiple batteries are involved, load balancing among batteries may also become important. For example, to extend time until the batteries would have to be recharged, it may be more preferable to distribute power load more evenly among the plurality of batteries in some embodiments. On the other hand, if the need is to provide for backup power sources, it may be more preferable to concentrate load on some batteries, setting aside others as reserve power sources.

When batteries are coupled to power charging devices, the batteries may similarly negotiate for power parameters based on one of several other constraints or goals. For example, according to one embodiment, minimizing recharge time and extending battery life may be important goals. To decrease charging time, for example, the batteries may need to be charged at a high power setting. To extend battery life, the batteries may need to be charged under a more modest power load. The optimal load for a battery may be further optimized for each battery by model, brand and/or type. In an embodiment, a charging device may concentrate power on a few batteries to quickly charge those batteries so some batteries are quickly made available while the rest of the batteries are charged at a more moderate rate.

Another aspect of the invention relates to determining a battery's charge state. In an embodiment, the assessment may be carried out by measuring several properties of a battery and the battery's environment. According to an embodiment, the measurements may be taken either while the battery is charging or discharging or both. According to another embodiment, the measurements may involve the same measurements taken to assess quality assessments of a battery's core described above.

Figure 4A:
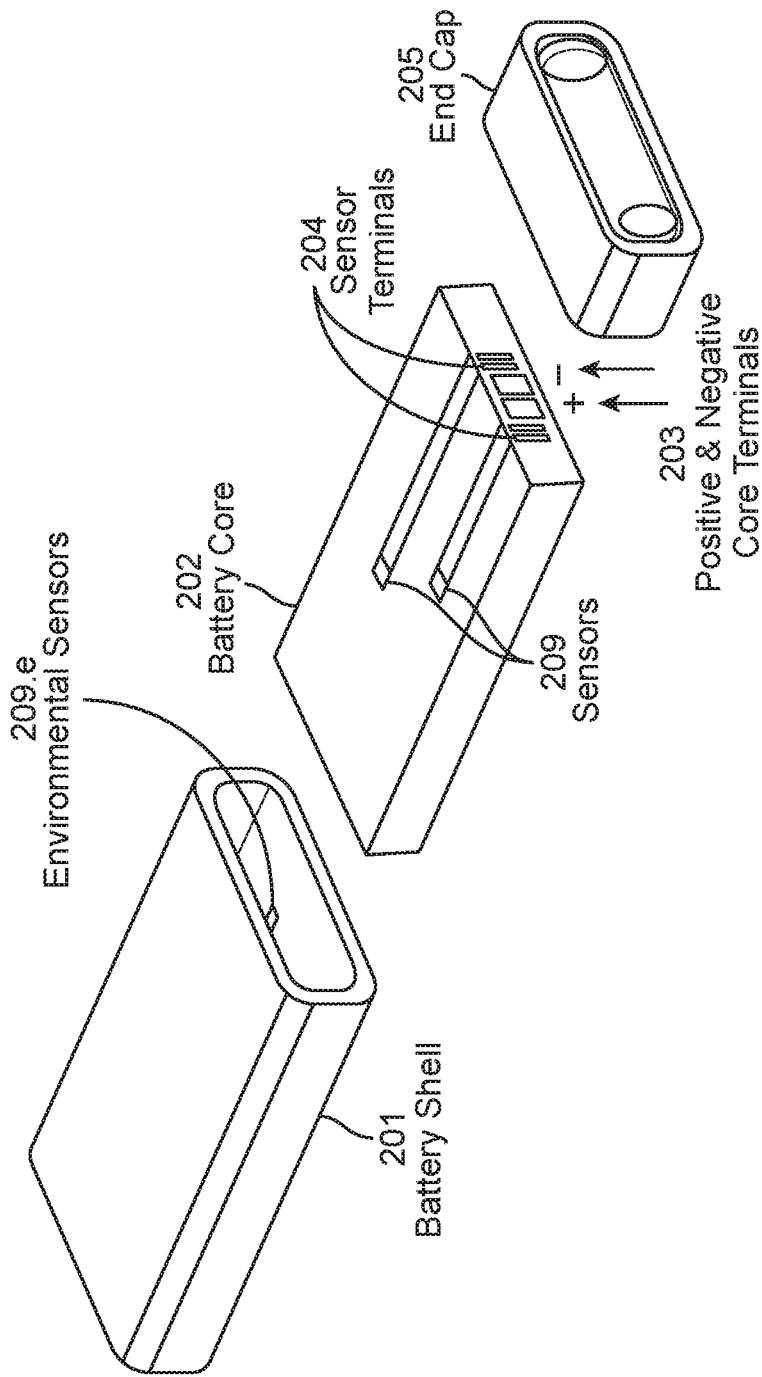
FIG. 4A shows a perspective view of components including various sensors of an embodiment of a rechargeable battery adapted to measure various properties of the battery.

FIG. 4A shows a perspective view of various sensors adapted to measure properties of the battery that may be useful to determine a battery's charge state. In one embodiment, the battery may be provided with sensors 209 adapted to measure the pressure and temperature or the voltage and current flowing into or out of battery core 202. In another embodiment, the battery may also be provided with sensors 209.e that may be fitted along battery shell 201 to measure various ambient properties of the battery, including ambient humidity and temperature. Sensor terminal 204 may be adapted to conduct signals from sensors to electrical component 208 and vice versa.

In an embodiment, to better assess the charge state or quality of a battery, measurements of battery characteristics such as voltage and current or pressure and temperature may be correlated with a power load. For example, the fact that the temperature of a battery core is at a certain threshold may not mean much unless that temperature is correlated with a power input or output at the given temperature.

Measurements of battery characteristics may also be normalized against environmental factors. Trends in the observed characteristics may, according to an embodiment, be used to assess a battery's quality state, charge state, or other characteristics. According to another embodiment, a battery may also use trends in recorded power usage to estimate future power needs of a battery. According to an embodiment, a battery may be adapted to provide, based upon various measurements from the sensors and recorded trends, an estimated time to until a battery will become charged if the battery is undergoing charging or a time until a battery will become drained if the battery is providing power.

In a specific embodiment, the pressure and temperature of the core may be first normalized against a measured power load. The normalized measurements may further be adjusted for environmental factors such as humidity and temperature. If the normalized and adjusted pressure and temperature measurements is monitored to rise above or fall below a predetermined threshold, the observation could be used to derive important information regarding a battery's charge state, quality, or other characteristics. Similar assessments can be done for the voltage and current.

For example, if the voltage and current, normalized for a power load and adjusted for environmental factors such as humidity and temperature, is monitored to rise above or fall fellow certain thresholds, the measurements could similarly be used by themselves, or in conjunction with the pressure and temperature measurements described earlier, to derive important information about a battery's quality, charge state, or other characteristics.

According to an embodiment, the assessment of charge state, quality, or other characteristics may be carried out by the battery itself or by external entities such as host machines and accessory devices. In an embodiment where the external entities are adapted carry out the assessments, the external entities may not have direct access to internal properties of the batteries such as pressure and temperature of the battery core useful in assessing various characteristics of a battery. In one embodiment, the battery may be adapted to communicate measurements of internal properties (obtained from internal sensors such as 209 and 209.e) to the external entities. In another embodiment, the external entities may rely on external measurements of battery properties to infer the battery's internal measurements. In yet another embodiment, the assessment of a battery's charge state, quality, or other characteristics may be derived from external measurements alone.

In general, according to an embodiment, information may be passed among the batteries, power consuming devices, and power charging devices. In one embodiment, the batteries may be adapted to communicate the battery's internal measurements of internal properties such as voltage, current, temperature and pressure to external entities to the external entities. In another embodiment, the batteries may be adapted to communicate the battery's own assessment of the battery's quality, charge state or other characteristics to the external entities.

According to an embodiment, the communication among the batteries and the external entities may in general take place either directly or may be relayed. In one embodiment, the batteries may be adapted to communicate information directly with the directly coupled entities—usually either a host machine or an accessory device. In another embodiment, information to and from a battery may be adapted to be relayed through other external entities, such as another host machine or another accessory device, as appropriate.

In an embodiment, when a battery detects that it is about to run out of charge, it may signal to the coupled accessory device of the information. The accessory device may in turn relay the information to a host machine, which may in turn alert a user of the situation. For example, if a battery is about to run out of charge, the host machine may be adapted to alert a user of that fact for the user to take appropriate actions. A user may for example need to save his work if it turns out that the temporary decommissioning of a wireless peripheral while a battery is being recharged or replaced is too big an obstacle to continue with work.

In one embodiment, once alerted that a battery is about to become discharged, a user may save his work, locate the accessory devices with the drained batteries, and place the battery or batteries into the charging slot(s) on a host machine for immediate recharging. In another embodiment, a host machine may be adapted to provide an estimated time to discharge. In the embodiment, a host machine may correlate the charge state of the battery with the power requirements of the device to which the battery is coupled to offer a predicted time until the battery will need to be recharged.

For batteries with less than a few hours of time left until the battery will need to be recharged but is in no danger of immediate discharge, a host machine may be adapted to remind a user when a user logs out to place those batteries in the host machines to recharge so the batteries will be ready with a complete charge when the user logs in to use the host machine the next time.

Figure 4B:
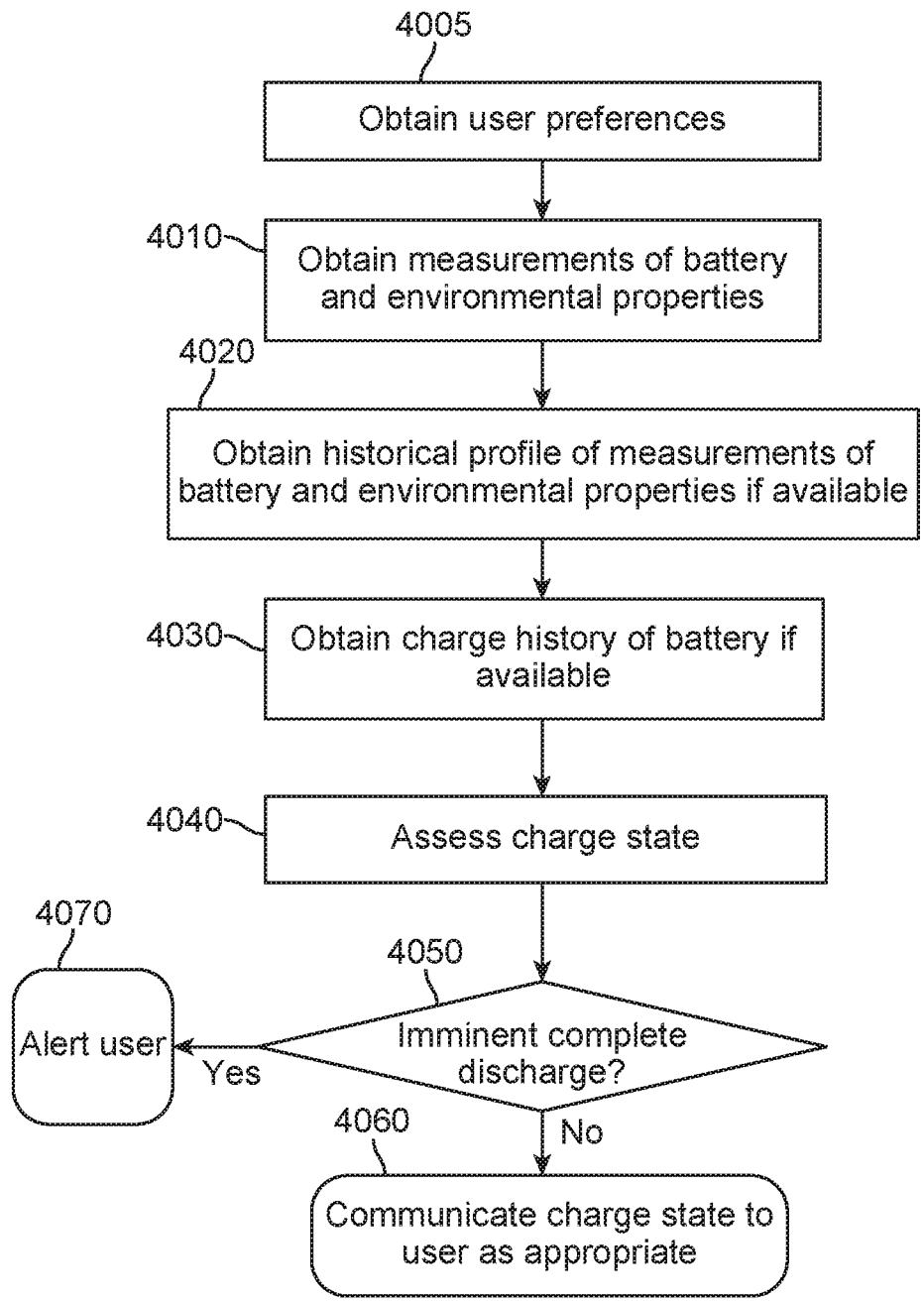
FIG. 4B illustrates an exemplary process involved in assessing a battery's charge state when a battery is connected to a power consuming device.

FIG. 4B illustrates an exemplary process involved in assessing a battery's charge state when a battery is connected to a power consuming device. In the first step, user preferences may be obtained as part of the initialization process in step 4005. In step 4010, measurements of battery and environmental properties may be obtained. In one embodiment, the temperature and pressure of the battery core, the temperature and humidity of the ambient environment, and the current and voltage of power flowing out of the battery may all be measured.

In step 4020, the historical profiles of battery and environmental properties, if available, may be obtained. These records can be useful in interpreting the various measurements presently obtained. For example, as batteries age, the temperature and pressure of a battery core per unit of power load may change. Correlating trends of such changes may help in more accurately inferring a charge state. In addition, in step 4030, the charge history of the battery may also be obtained.

For some batteries, battery properties may degrade with the number of charge cycles. Age thus may sometimes be better characterized by the number of charge cycles, possibly in combination with the trends of changes in battery properties as measured in step 4020. In step 4040, the charge state of a battery may be assessed based on a combination of the information obtained and processed in steps 4010 to 4030. In step 4050, if it is assessed that the battery is about to be imminently discharged, depending on user preferences, the system may alert the user in step 4070. In a specific embodiment, depending partly on the user preferences obtained in step 4005, the user may be alerted by a message displayed on a computer screen, a text message sent to a user's cell phone, and/or an email sent to the user.

In another embodiment, if the battery state is communicated to a wireless accessory device, the device may relay the information to another device, such as the host machine, that may better communicate the message to a user. In yet another embodiment, if the battery state is evaluated by the battery, the battery may send a message to the wireless accessory device or the host machine to which it is coupled. If the message is relayed to an accessory device, the accessory device may be adapted to further forward the information to another device, such as the host machine, that can better communicate with a user, as described above. In step 4060, status information regarding the current charge state of batteries may be communicated to users, depending, according to one embodiment, on user preferences obtained in step 4005.

Figure 4C:
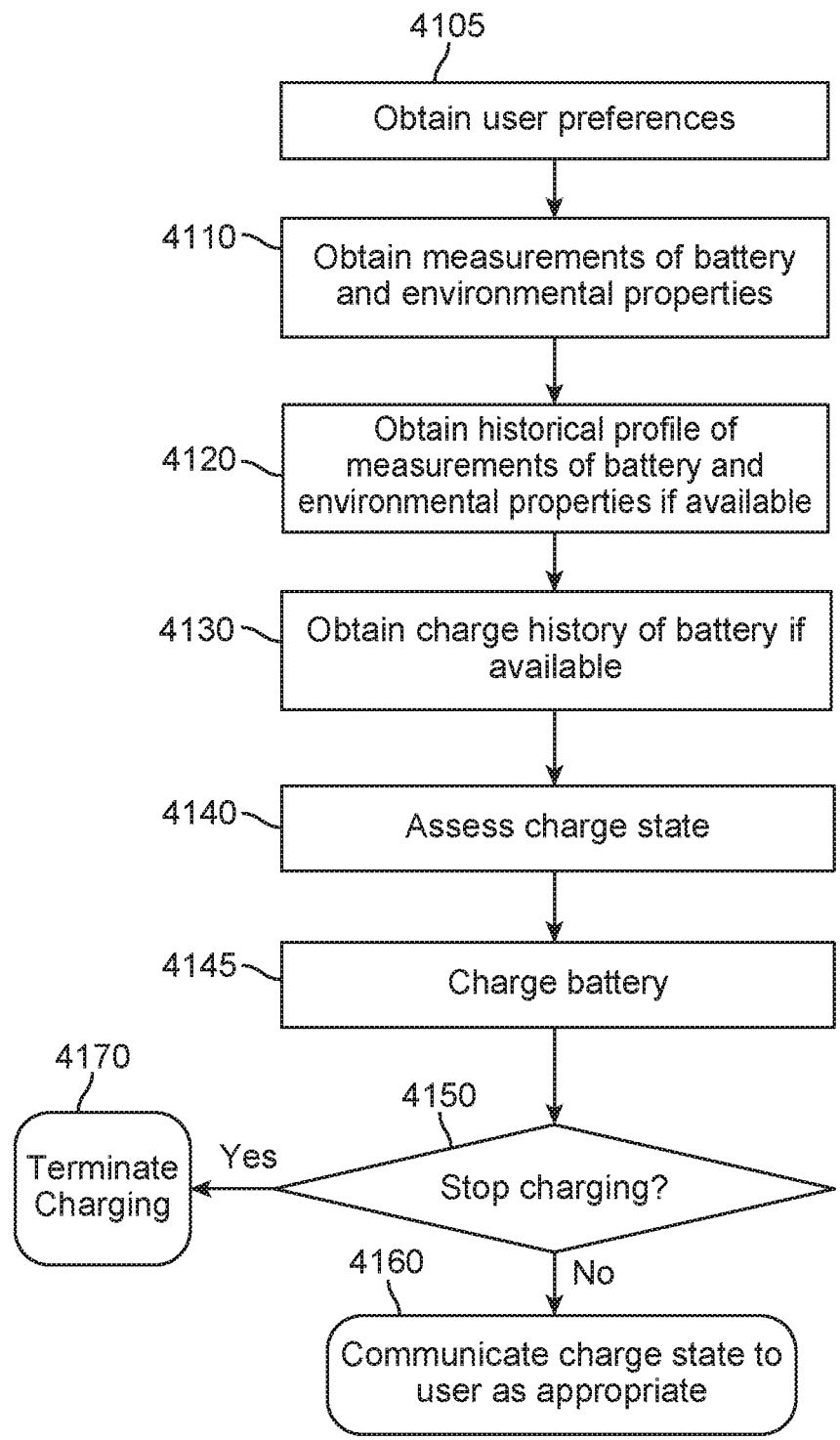
FIG. 4C illustrates an exemplary process involved in assessing a battery's charge state when a battery is connected to a power charging device.

FIG. 4C illustrates an exemplary process involved in assessing a battery's charge state when a battery is connected to a power charging device. In the first step, user preferences may be obtained as part of the initialization process in step 4105. In step 4110, measurements of battery and environmental properties may be obtained. In one embodiment, the temperature and pressure of the battery core, the temperature and humidity of the ambient environment, and the current and voltage of power flowing into the battery may all be measured.

In step 4120, the historical profiles of battery and environmental properties, if available, may be obtained. These records can be useful in interpreting the various measurements presently obtained. For example, as batteries age, the temperature and pressure of a battery core per unit of power charge may change. Correlating trends of such changes to age may help in more accurately inferring a battery's charge states.

In addition, in step 4130, the charge history of the battery may also be obtained. For some batteries, battery properties may degrade with the number of charge cycles. Age thus may sometimes be better characterized by the number of charge cycles, possibly in combination with the trends of changes in battery properties as measured in step 4120. In step 4140, the charge state of a battery may be assessed based on a combination of the information obtained and processed in steps 4110 to 4130. At step 4145, power is delivered to recharge the battery. In step 4150, if it is assessed that charging should stop, the system terminates charging in step 4170.

In general, the decisions on when to stop charging may be optimized for a variety of goals and depend partly on user preferences. For example, if a user specifies that the battery should be charged to the battery's fullest capacity, charging would stop, according to one embodiment, when the battery is completely charged. However, if the user specifies to maximize the lifetimes of batteries, charging may need to stop short of a full complete charge.

Similarly, the rate at which a battery is charged may also change depending on user goals. In an embodiment, a battery may be charged at a regular and fast rate. While users probably typically prefer fast recharge rates, sometimes a slower rate may be preferred to maximize battery lifetimes.

In another embodiment, the rate at which batteries are charged may also change based on information derived from the battery, allowing a battery to be charged at different rates based on feedback from the battery as the battery is being charged. In one embodiment, the information from the battery may comprise information such as battery's current and voltage input or output. In another embodiment, the information may include a battery core's temperature and core pressure response in response to a charging (intake) or discharging (outtake) load. In an embodiment, a battery might be initialized charged at a fast rate, but as the core heats up, the rate may be slowed as appropriate to protect the battery.

Another aspect of charging involves the determination of when to perform a recondition on a battery. According to an embodiment, some batteries may need to be completely discharged or reconditioned every predetermined number of charge/discharge cycles. According to an embodiment, the decision whether to undergo reconditioning may be based on assessments of measurements of the battery's core. According to a specific embodiment, batteries may undergo reconditioning based on temperature and pressure response of the battery core in response to a known power intake (charge) or power outtake (discharge). According to another embodiment, batteries may undergo reconditioning based on the number charge/discharge cycles.

Figure 5A:
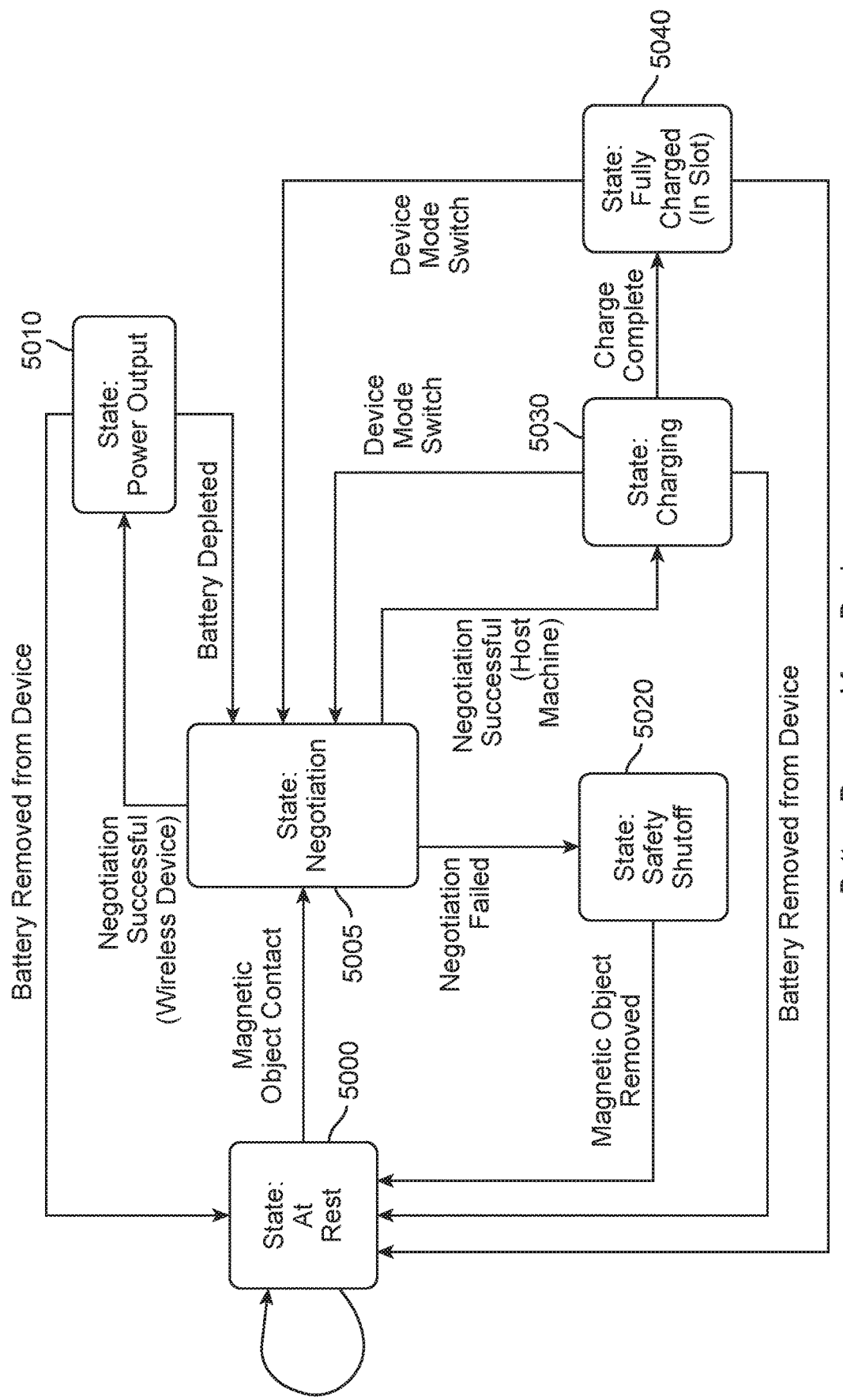
FIG. 5A shows a state diagram of the major states of a universal rechargeable battery in accordance with an embodiment of the current invention.

FIG. 5A shows a state diagram of the major states of a universal rechargeable battery in accordance with an embodiment of the current invention. When a rechargeable battery is not connected to any device, the battery may be at Rest State 5000. At Rest State, the battery may not normally emit any power except for periodically entering Negotiation State 5005. In one embodiment, upon entering Negotiation State 5005, the battery may emit a low voltage handshake to attempt to initiate negotiations with an electronic device.

In an embodiment, a battery may be prevented from entering Negotiation State 5005 unless objects emanating specific patterns of magnetic fields are brought into contact or in close proximity with the battery. In one embodiment, the specific patterns of magnetic fields may be characterized by a threshold strength and orientation of flux. In a specific embodiment, the battery may include a special magnetic safety switch which is activated only in the presence of special magnetic fields and which enables the battery to enter into Negotiation State 5005 only when activated.

According to an embodiment where a battery is coupled to a power consuming device, if the battery successfully negotiates for a set of power parameters at which to output power, the battery may enter Output State 5010 and proceed to output power at the negotiated power output parameters. If the battery is removed from the power consuming device, the battery may go back into Rest State 5000. If the power becomes depleted, the battery may shut down and go into Negotiations State 5005, attempting to look for and negotiate with another power charging device.

According to an embodiment where a battery is coupled to a power charging device, if the battery successfully negotiates for a set of power parameters at which to receive power at 5005, the battery may proceed to accept power at the negotiated power parameters in state 5030. Upon recharge 5040, the battery may enter into Rest State 5000. If a power consuming device with the proper magnetic field signature is then brought nearby a battery at Rest State 5000, the battery may enter into state 5005 to attempt negotiations with the power consuming device for a set of power parameters at which to provide power to the power consuming device. If the battery successfully negotiates for a set of power parameters at which to output power, the battery may enter Output State 5010, as described above. In the absence of any magnetic signature of any electronic device, the battery may remain at Rest State 5000.

If any of negotiations above—whether with a power consuming or power charging device—fails for any reason, the battery may enter into Safety Shutoff State 5020. In Safety Shutoff State 5020, the battery core can be disconnected from the battery terminals. Accordingly, according to an embodiment, even if an accidental short were to develop while a battery is in 5005, such as by a magnetic metallic object, between the terminals of a battery, the power should be switched off soon enough that no major damage or power drain results.

In general, according to an embodiment, negotiation may fail for many reasons. In one embodiment, as just discussed, negotiations may fail because the battery is not connected to any device but is instead shorted by a metallic, magnetic object. In another embodiment, the battery may be coupled to a device but negotiations may fail because the device and the battery do not share common range of power parameters for compatible operations. In another embodiment, negotiations may fail because the battery is coupled to a device in an incorrect configuration.

Figure 5B:
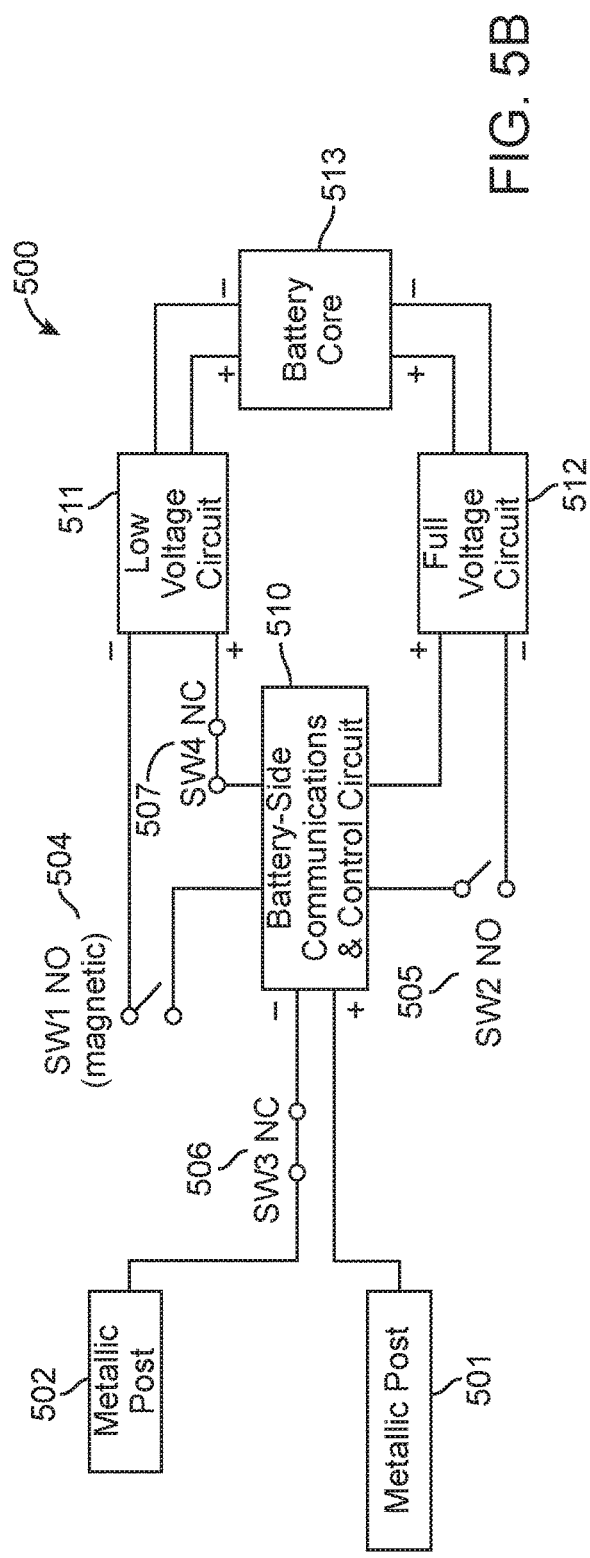
FIG. 5B illustrates the functional schematics of the Resting State of an exemplary universal battery.

FIGS. 5B-5I illustrate several functional schematics of an embodiment of a universal battery. FIG. 5B illustrates the functional schematics of Resting State 5000 of an exemplary universal battery 500. As illustrated, an exemplary battery includes metallic posts 501 and 502, four switches (Switch 1 504, Switch 2 505, Switch 3 506, and Switch 4 507) that serve a variety of purposes that will be described in more detail below, Communications and Control Circuit 510, a configurable Power Transmission Circuit depicted as Low Voltage Circuit 511, a configurable Power Transmission Circuit depicted as Full Voltage Circuit 512, and Battery Core 513.

The Low Voltage and Full Voltage circuits may represent electrical components that allow connections between the battery core and a coupled electronic device to be configured at various power settings or parameters. In an embodiment, Low Voltage Circuit 511 allows a minimum threshold of power to pass between battery core 513 and the electronic device. According to an embodiment, a low power signal may be used for the initial handshake communication between a universal battery and an electronic device before the power parameters of either the battery or the devices has been ascertained. Full Voltage Circuit 512 allows effective power transmission of electricity between battery core 513 and the electronic device at various power parameters. According to one embodiment, the full voltage mode should be allowed only after the power parameters of the electronic device to which a battery is coupled have been ascertained.

According to an embodiment, during Resting State 5000, switches 1 and 2 (504 and 505, respectively) are normally open, whereas switches 3 and 4 (506 and 507, respectively) are normally closed, as depicted in FIG. 5B. In the exemplary embodiment, Switch 1 504 may be adapted to close only in the presence of specific magnetic fields, and Switch 2 505 is adapted to close only after the battery has successfully negotiated with an external device to accept or output power. Since both switches 1 and 2 (504 and 505, respectively) are normally open, neither the Low Voltage Circuit nor the Full Voltage Circuit is normally engaged during the Rest State. Consequently, there is normally no power drain, neither externally nor internally, when during the Rest State.

Figure 5C:
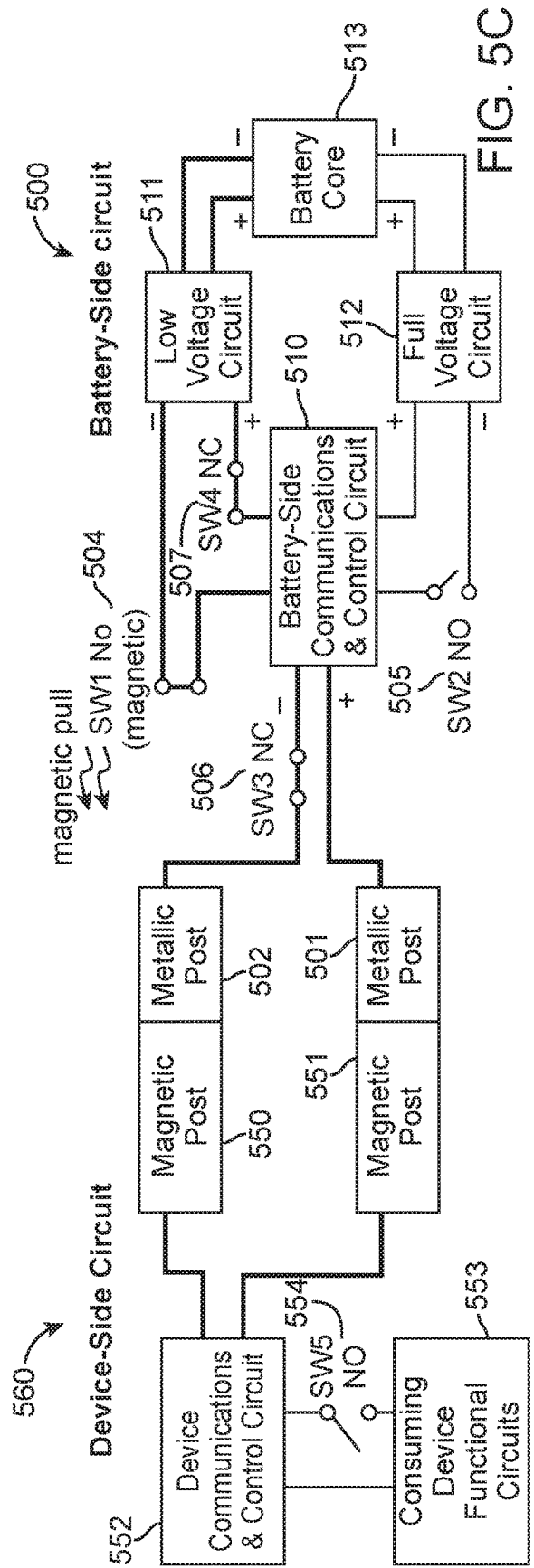
FIG. 5C illustrates the functional schematics of the initial handshake negotiation of an exemplary universal battery.

FIG. 5C illustrates the functional schematics of the initial handshake negotiation of exemplary universal battery 500. The initial handshake may occur when a battery is first connected to electronic device 560. In the embodiment, the initial handshake process may begin with the battery ascertaining whether it is connected to an intelligent device adapted to function with a universal battery. If it is, according to the embodiment, the battery next determines whether the electronic device is a power consuming or power charging device. In the case where it is both, the battery will determine which mode, power consuming or power charging, the device is currently in. If the device is a power consuming device or in a power consuming mode, the battery may negotiate with the device for a set of power parameters at which the battery will output power to the power consuming device. If the device is a power charging device, the battery may negotiate for power parameters at which the charging device will receive power from the battery charging device.

In an embodiment, the electronic device 560 can comprise magnetic posts 550 and 551 which emit a specific magnetic field that closes magnetic Switch 1 504 on the battery. According to another embodiment, only one of posts 550 and 551 needs to be magnetic. According to yet another embodiment, only a portion of one post needs to be magnetic. In any case, according to the embodiment, the idea is to generate a strong magnetic flux capable of closing magnetic switch 504 on the battery. According to an embodiment, when magnetic Switch 1 504 is closed, Low Voltage Circuit 511 is connected to electronic device 560. At this stage, only a very low power signal may be allowed to be transmitted between the universal battery and intelligent device 560, as depicted by the engagement (darkened path) of Low Voltage Circuit 511 in FIG. 5C.

In general, according to an embodiment, Low Voltage Circuit 511 may serve at least two purposes. In one embodiment, the circuit may prevent permanent damage to the battery or the shorting objects (including living tissues) that inadvertently come in contact with the battery terminals. According to an embodiment, the circuit may allow a battery to couple and to initiate handshake communications with a power consuming electronic devices before the power ratings of the power consuming device has been established. In another embodiment, the circuit can allow a power charging device to allow the battery to initiate handshake communications with the power charging electronic before the power charging device has had the opportunity to assess the power ratings of the battery.

Figure 5D:
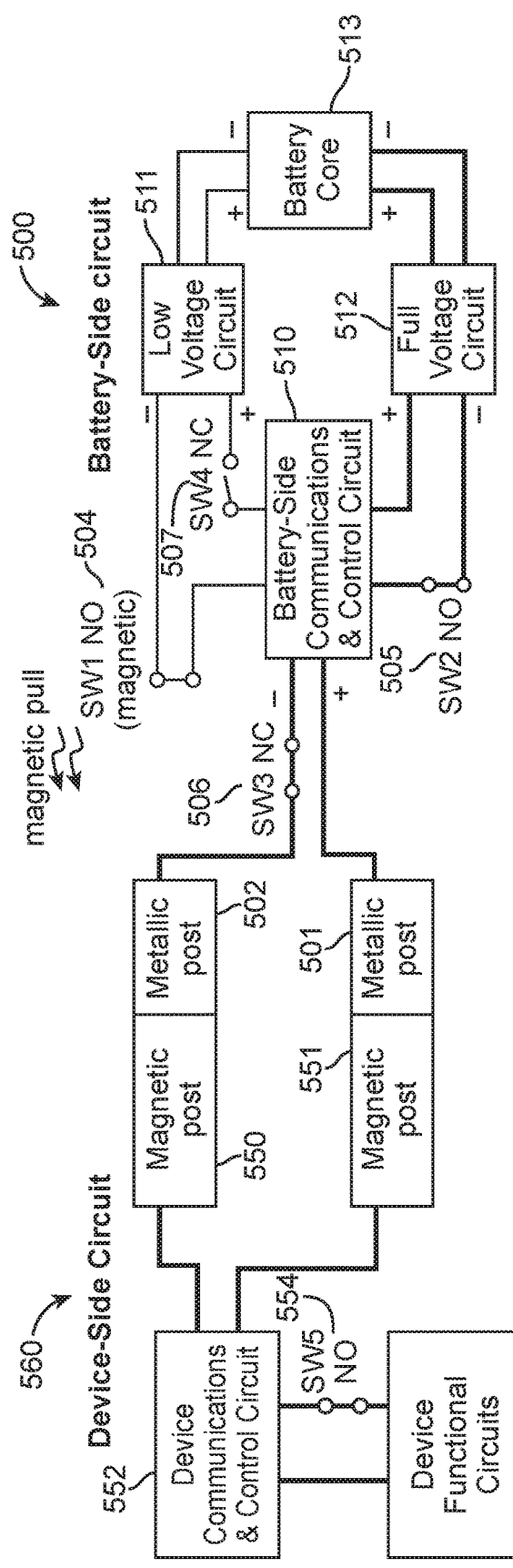
FIG. 5D shows the functional schematics of a successful connection state according to an embodiment of the invention.

FIG. 5D shows the functional schematics of a successful connection state according to a specific embodiment of the invention. In this mode of operation, effective power transmission can be conducted between the battery and the coupled device. The power delivered may be either by a battery for powering a power consuming device or by a charging device for charging a battery. As can be seen, upon successful negotiation of power parameters, the battery may open Switch 4 507 and close Switch 2 505, disconnecting the electrical terminals from Low Voltage Circuit 511 and connecting the electrical terminals to the Full Voltage Circuit 512.

According to an embodiment, Full Voltage Circuit 512 can then connect the battery terminals 501 and 502 to battery core at the agreed upon power parameters. If the electronic device is a power consuming device, power may be drawn from the battery core 513 through Full Voltage Circuit 512 to electronic device 560 at the agreed upon power parameters. If the electronic device is a power consuming device, power may be transferred from electronic device 560 through Voltage Circuit 512 to battery core 513 at the agreed upon power parameters. In an embodiment, the electronic device (either a power consuming device or a charging device) may possess safety Switch 554 as a redundancy feature. The switch may close only upon successful negotiation of power parameters with the battery to ensure that power flows in the device side only upon successful negotiations of power parameters.

Figure 5E:
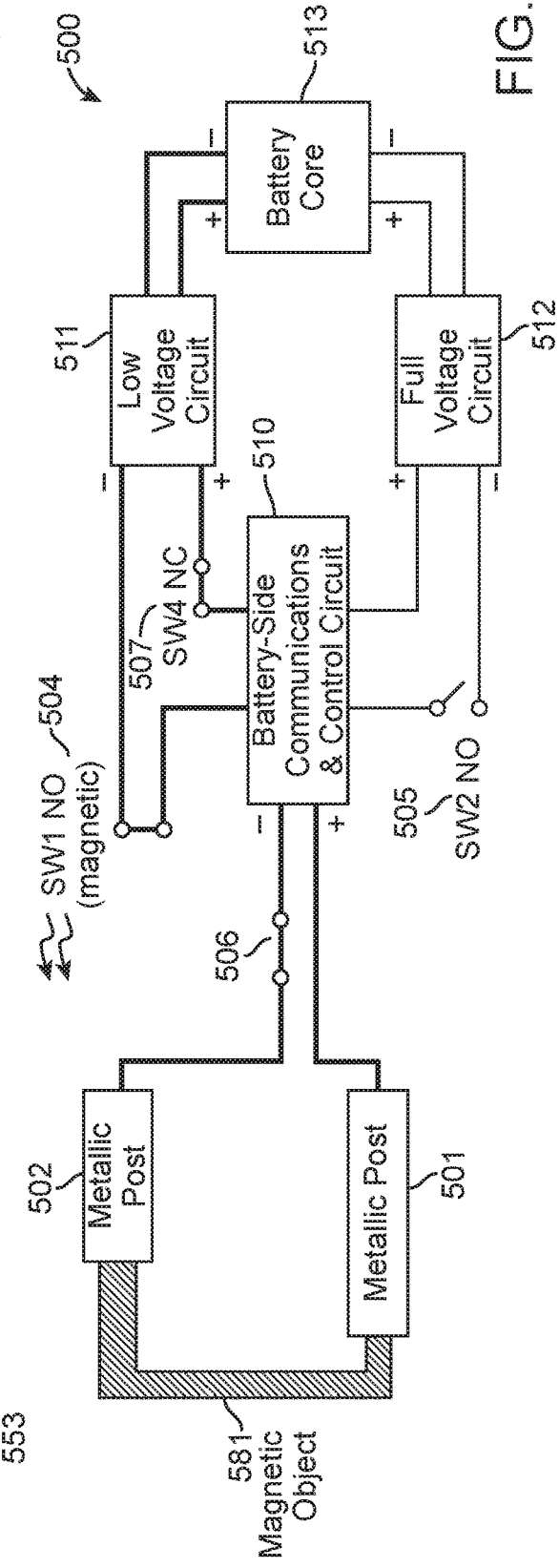
FIG. 5E shows the functional schematics when a battery's electrical terminals are shorted in accordance with an embodiment of the invention when the low voltage circuit is connected. 5F shows the functional schematics of when a battery's electrical terminals are shorted in accordance with an embodiment of the invention when the low voltage circuit is disconnected. 5G shows the functional schematics of when a battery's electrical terminals are shorted in accordance with another embodiment of the invention when the low voltage circuit is disconnected.

FIG. 5E shows the functional schematics of an accidental shorting of a battery's electrical terminals. In FIG. 5E, terminals 501 and 502 are shorted by a metallic object. According to an embodiment, the shorted circuit may not cause any damage because in the absence of magnetic fields, Switch 1 504 would remain open, disconnecting Low Voltage Circuit 511 as in FIG. 5B. According to the embodiment, no electricity can accidentally flow from the battery core even when the terminals are shorted because the battery core is not connected to the battery terminals.

In another embodiment, the short occurs in the presence of some ambient magnetic fields. In one embodiment, the ambient field might emanate directly from the object causing the short, such as a magnetic, metallic object 581. In another embodiment, the magnetic field may emanate from other ambient sources. In any case, according to an embodiment, the existence of the ambient fields does not matter because the magnetic fields are not adapted to close Switch 1 504. The magnetic fields may not be strong enough, or the magnetic flux may not be of the right type (e.g. orientation) to trigger the closing of Switch 1 504.

In another embodiment, the ambient magnetic fields might be of a type that can interfere with and cause magnetic Switch 1 504 to accidentally close, as shown in FIG. 5E. According to the embodiment, even were magnetic Switch 1 504 to accidentally close, little damage would result because only a low power flow may be permitted to flow across magnetic object 581. Because Switch 2 505 is normally open in the absence of an affirmative confirmation of a successful negotiations, the battery core may be connected to the battery terminals only through Low voltage Circuit 511. According to the embodiment, since a stray object causing the short usually do not have the capability to negotiate with the battery, Full Voltage Circuit 512 would usually not be engaged when the terminals of a battery are accidentally shorted by a stray object. Consequently, when the battery is accidentally shorted, the worst that may result may be a low powered short that, according to the embodiment, causes little if any damage.

According to an embodiment, what little chance for damage that may result from a low powered short may be even further reduced because a low powered short may be allowed only for a short period of time. As described earlier, batteries in Rest State periodically send a low voltage signal to attempt to negotiate with a coupled electronics device. According one embodiment, the low powered short of FIG. 5E may correspond to Negotiation State 5005 depicted in FIG. 5A. If negotiation fails for any reason, as when a short occurs, the battery will enter Safety ShutOff State and re-enter Rest State.

FIG. 5F shows the functional schematics of the shorting of a battery's electrical terminals when the low voltage circuit has been disconnected, such as after a Safety Shutoff has been initiated. In the embodiment, a magnetic, conductive object 581 placed across metallic posts 501 and 502 causes a short for a short time. After the battery has not explicitly received a successful negotiation acknowledgement, the battery re-opens Switch 3 506. The opening of the switch, according to one embodiment, cuts off the low power flow of electricity after a predetermined time. The short is terminated when the battery enters into Safety Shutoff State 5020 and Rest State 5000.

FIG. 5G shows the functional schematics of the shorting of a battery's electrical terminals when the low voltage circuit has been disconnected. In the embodiment, a magnetic, conductive object 581 placed across metallic posts 501 and 502 causes a short for a short time. However, since conductive object 581 is not magnetic in this embodiment, switch 504 is open, cutting off any flow of electricity. The short accordingly does not cause any damage or injury.

FIG. 5H illustrates the coupling of a battery to an electronic device with a complementary type of battery and in a correct configuration. An aspect of the current invention involves the use of physical form factors to enhance proper and safe coupling between a battery and an electronic device. To reduce the risk of inadvertent power flows, a battery may also be adapted to conduct power through inductive means such as through magnetic fields.

As illustrated in FIG. 5H, one embodiment involves associating terminal leads of a particular physical form factor with a specific type of battery. For example, each of two terminals of a battery of a specific type can be designed to feature a specific length. In an embodiment, the form factor of the terminal leads includes complementary form factors such that for the terminal leads to form a proper electrical conducting circuit, the electronic device must be coupled to the battery of the correct type and in a correct configuration.

FIG. 5I illustrates the coupling of a battery to an electronic device of an incompatible type or in an incorrect configuration. As is illustrated, when a battery of an incorrect type is coupled with the electronic device or when a battery is coupled with an electronic device in an incorrect configuration, no proper electrical coupling may be formed between the universal battery and the electronic device.

Another aspect of the current invention involves the use of the same electrical path for transmitting and receiving communications signals and for transmitting and receiving power signals between a device and a battery. In one embodiment, because the communications and powers signal travel over the same electrical path, special precautions may need to be taken to make sure they do not interfere with each other. In a first embodiment, two separate time windows may be reserved for transmitting communications signals and for transmitting power signals. In a second embodiment, the communications signal may be modulated over the power signal during a common time window.

Figure 6A:
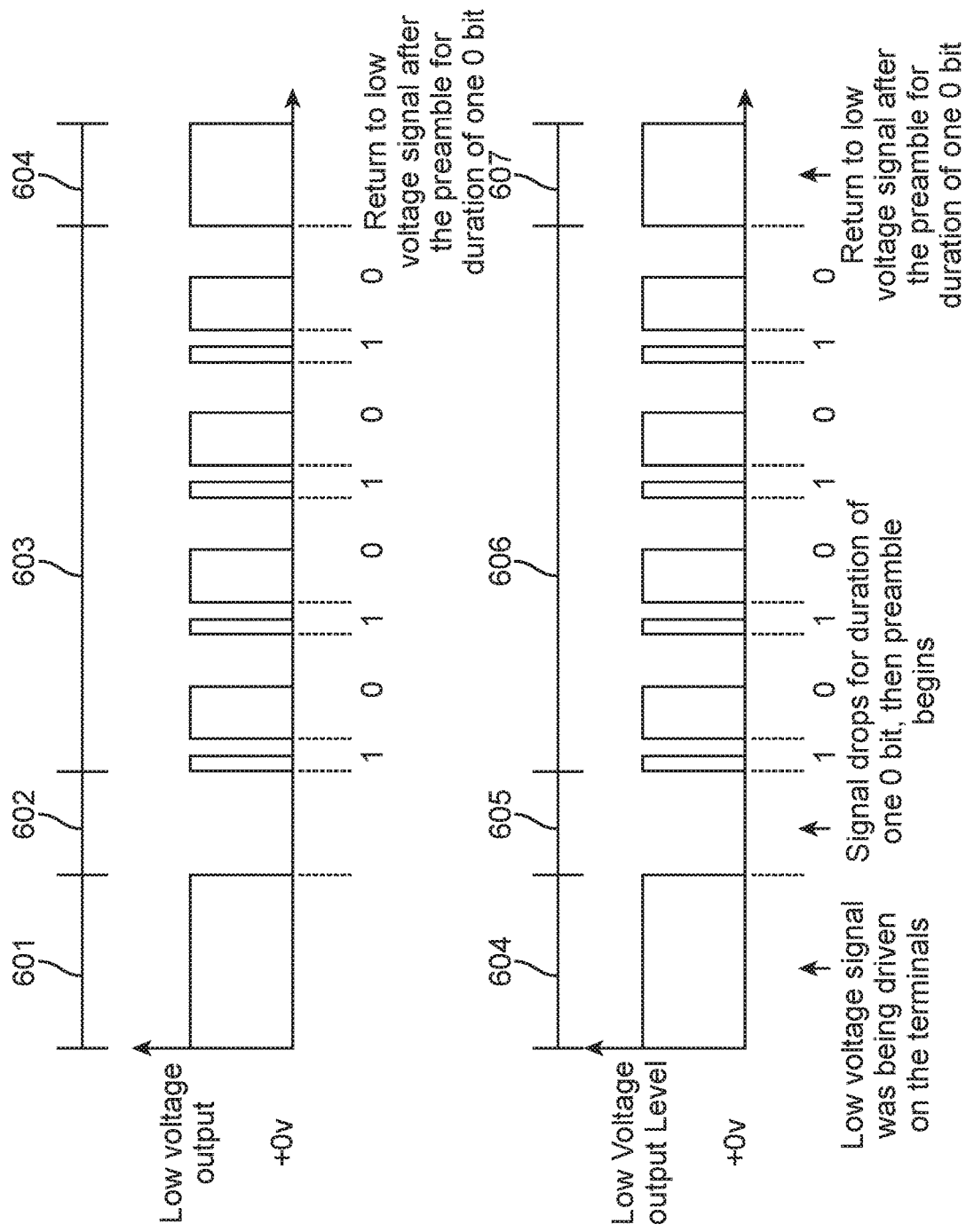
FIG. 6A depicts the transmission of a low voltage communications signal according to an embodiment of the invention.

FIG. 6A depicts the transmission of a low voltage communications signal according to an embodiment of the invention. One benefit of transmitting communications signals at low voltage levels is that low voltage signals allow devices and batteries to communicate with each other each without each having to ascertain the power capabilities of each other first. The transmission of signals take place at low enough powers that there is little chance of damage to each other regardless of what the power rating of each turn out to be. Negotiations may take place during this phase. Once the power parameters are agreed upon, the battery and the device may go into transmitting high voltage power at a subsequent time window.

The transmissions shown in FIG. 6A are broken into 8 distinct windows of transmission 601, 602, 603, 604, 605, 606, and 607. In an embodiment, the first window of transmission 601 may represent the initial window of transmission by an intelligent, universal battery when first connected to an electronic device. A constant low voltage probing signal may be sent by the battery when magnetic fluxes from the device have closed Switch 1 504 as discussed above in FIGS. 5C and 5E. When the battery recognizes that a device is connected, the initial probing low voltage signal may be turned off, as shown in time window 602, beginning a window of prelude before negotiations communication begins.

According to an embodiment, at the end of time window 602, the battery may begin transmitting a digital signal representing a sequence of 0 and 1 bits. The low voltage signal may be pulse width modulated signals, as shown, or may be encoded by other schemes, including amplitude or frequency modulated schemes. After the battery completes transmitting a first series of signals, the battery may return to outputting a low voltage signal in time window 604 similar to that transmitted in time window 601. Next, it may be the device's chance to responds with its series of signals.

At some preset time, the battery may stop transmitting the low voltage signal, and the system may enter into a window of silence of time window 605 similar to the window of prelude 602. The device commences transmitting signals to the battery in time window 606. This signal from the device to the battery may represent an acknowledgement of an agreement if the device agrees with a power setting at which to operate suggested in a prior transmission from the battery.

After the signals have been transmitted, the device may return to transmitting a constant low signal in time window 607.

The cycle may begin again as the device silences and the battery adapted to send a second series of signals or acknowledgement transmissions afterwards. If all goes well, the battery-device system may terminate communications and enter into full power transmission mode. According to one embodiment, periodically during the full power transmission mode, the power transmitting device—either a battery or a power charging device—may need to shut off power temporarily to allow the battery and device to communicate with each other. In an embodiment, the battery may need to communicate with a power consuming device to check to see whether the current power settings at which power is output are still adequate. If the power settings are not adequate, a new round of negotiation for power parameters may be required.

In another embodiment, the battery may need to communicate with a power consuming device to signal that the battery is about to run out of power. The device may have to take preemptive action, such as storing settings or alerting a user, if an imminent power shutoff is expected. In another embodiment, a battery may need to communicate with a power charging device to convey the fact that the battery is charged and that the charging device may stop transferring power.

To minimize the disruption caused by the temporary termination of high power transmission to either a device or a battery, a capacitor-based system can be incorporated into the device or battery according to an embodiment. According to an embodiment, the capacitor system should at least store enough power to power the communication circuitry of the device or battery. Energy stored on a capacitor system onboard a battery should preferably enable the communication system on the battery to operate without tapping into the energy reserve in the battery core. This can reduce unnecessary load on the battery core and potentially increase battery life.

On the electronic device side, energy stored on a capacitor system on board a device should preferably enable the device to communicate even when no effective power is being transferred from the battery to the device. In another embodiment, the capacity of the capacitor onboard a device may be made even larger to enable the system to power the device during the communicative phase so little to no power interruption to the device results even as the battery-device system enters into periodic communications phase.

Figure 6B:
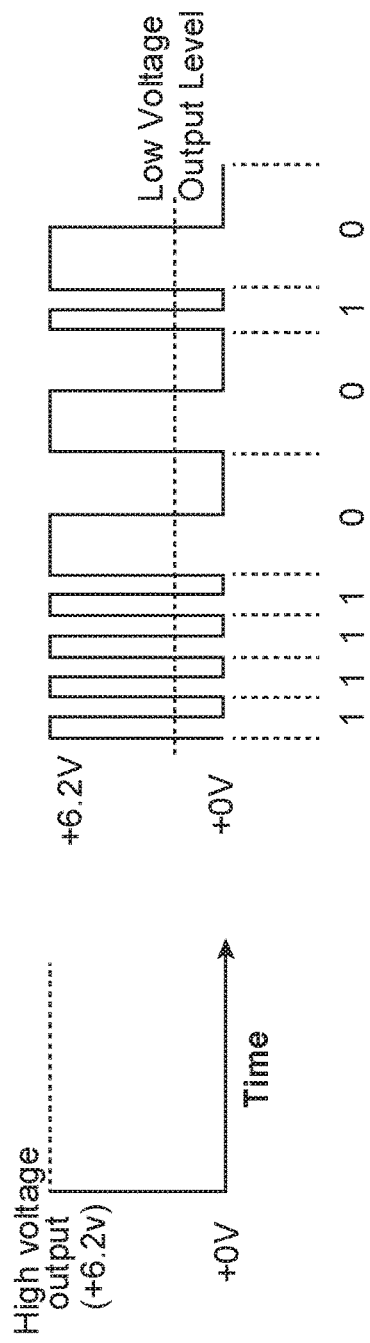
FIG. 6B illustrates the transmission of a high voltage communications signal according to an embodiment of the invention.

FIG. 6B illustrates the transmission of a high voltage communications signal according to another embodiment of the invention. Unlike the embodiment shown in FIG. 6A, the communications signals can be modulated at full power transmission voltage in FIG. 6B. In the embodiment, when battery and device enters into periodic communications phase, the communications transmission may be adapted to take place at the full transmission voltage, in this case 6.2V. Whereas the effective power transmission carried by a low voltage communications signal such as that shown in FIG. 6A may be nearly zero, the effective power transmission carried by the high voltage communications signal in FIG. 6B can be on average 50% of the full power transmission mode, irrespective of the statistical frequencies of 1 and 0's (this a characteristic of an embodiment of width modulated signals as depicted here).

Increasing the effective power transmission during communication mode can greatly reduce the impact communication mode has on effective power transmissions between the battery and device. To further reduce the impact communication mode has on effective power transmissions between the battery and device, the system may further incorporate a capacitor-based system similar to the one discussed above for FIG. 6A. A high-voltage communications mode may not be implemented in all systems. According to one embodiment, the battery and device should have ascertained each other's power ratings first to ensure that the high-voltage communications signals will not inadvertently damage each other.

Figure 6C:
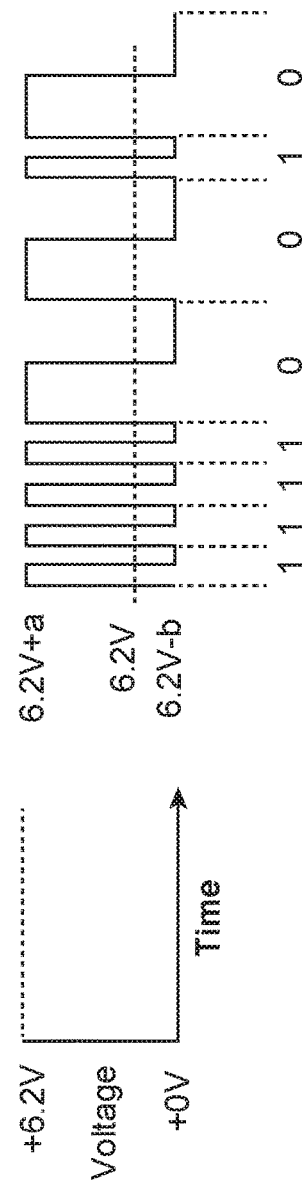
FIG. 6C illustrates the modulation of a communications signal over a power transmission signal according to an embodiment of the invention.

FIG. 6C illustrates the modulation of a communications signal over a power signal according to another embodiment of the invention. In this embodiment, signal transmissions between a battery and a device may be adapted to take place over the same time. The battery-device system may not need to enter into a separate communicative phase and a separate power transmissions phase as in the embodiments of FIGS. 6A and 6B. In the current embodiment, the communications signal may be superimposed or "piggy bagged" over the power transmission signal.

As shown on the left hand side of the figure, according to an embodiment, the power signal may be transmitted at a full voltage of 6.2V DC signal. When a communications signal is overlaid over the base power signal, the resulting signal may fluctuate between 6.2+a volts and 6.2−b volts, as shown on the right on side of the figure, where a and b represent part of the amplitude of the communications signal. According to an embodiment, the overall amplitude a+b is preferably small compared with the full power voltage, i.e. 6.2.

One advantage of the current embodiment is the reduction of disruptions to power transmission between the battery and device. Because the battery-device system may no longer need to undergo a communications phase where power is cut off, power can be transmitted 100% of the time. One potential disadvantage of such a system is the interference that could arise from the simultaneous transmission of power and communications signal. A sensitive battery may require to be charged at precisely 6.2V; a sensitive device may similarly require to be powered at precisely 6.2V. For such systems, the fluctuation of power between 6.2-b volts and 6.2+a volts may be too large and cause undesirable effects to the operations for certain power sensitive batteries and devices.

Figure 7:
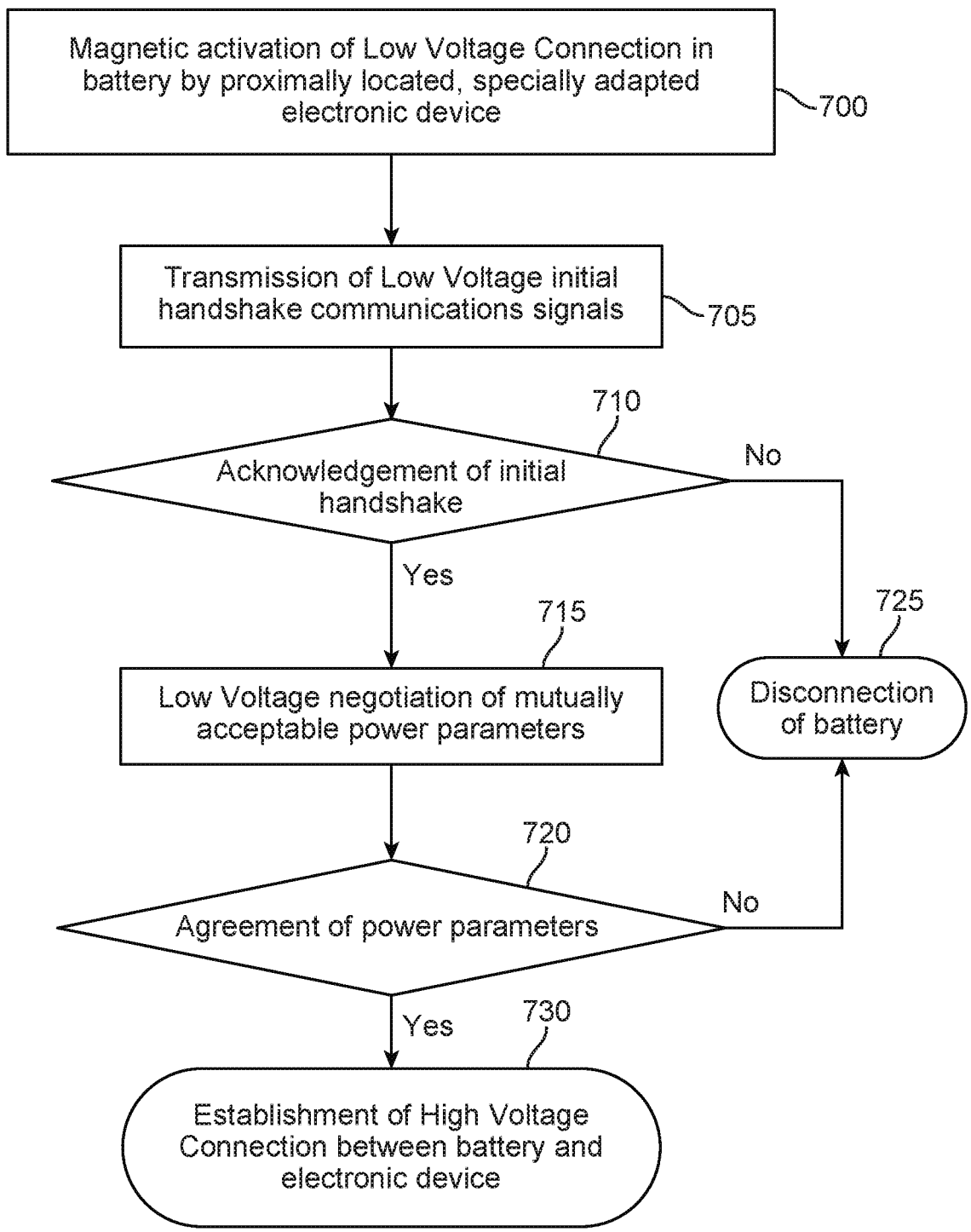
FIG. 7 illustrates an embodiment of the negotiation process between an electronic device and a universal battery.

FIG. 7 illustrates an embodiment of a negotiation process between an electronic device and a universal battery. In an exemplary embodiment, a universal battery at Rest State may be initially activated at 700 to negotiate for power parameters with a proximally located electronic device. In the embodiment, the electronic device may have been adapted to emit a specific magnetic field that to activated the battery. At 705, the battery initiate transmission of a low voltage handshake communications signals to an electronic device awaiting a handshake signal to be sent.

In an alternative embodiment, it is the electronic device that may be adapted to initialize the handshake process, with the battery waiting for a handshake signal to be sent. In either case, according to a current embodiment, the receiving device—whether a battery or a device—can be expected to send an acknowledgement in response to receiving an invitation to negotiate. In the embodiment, the negotiation process can proceed only when an acknowledgement is transmitted and received at 710. If no acknowledgement is transmitted and received at 710, the battery and the electronic device may disconnect from each other at 725. If an acknowledgement of the handshake is received, the negotiation process may proceed where the battery and the electronic device negotiates to find a common range of acceptable power parameters at which to operate at 715.

If at step 720 the negotiation results in an agreed set of power parameters, the battery and device may establish a high voltage connection at the agreed parameters between each other at 730. If the device is a power consuming device, the battery may begin outputting power and the device may begin accepting power at the agreed parameters. Alternatively, if the electronic device is a power supplying device (e.g., a battery charger), the battery may begin accepting power from the charger and the charger may begin to providing power to the battery at the agreed parameters. If no agreement of power parameters is reached, the battery and the device may disconnect from each other at step 725, preventing further power transmissions between the battery core and the charging device.

Figure 8:
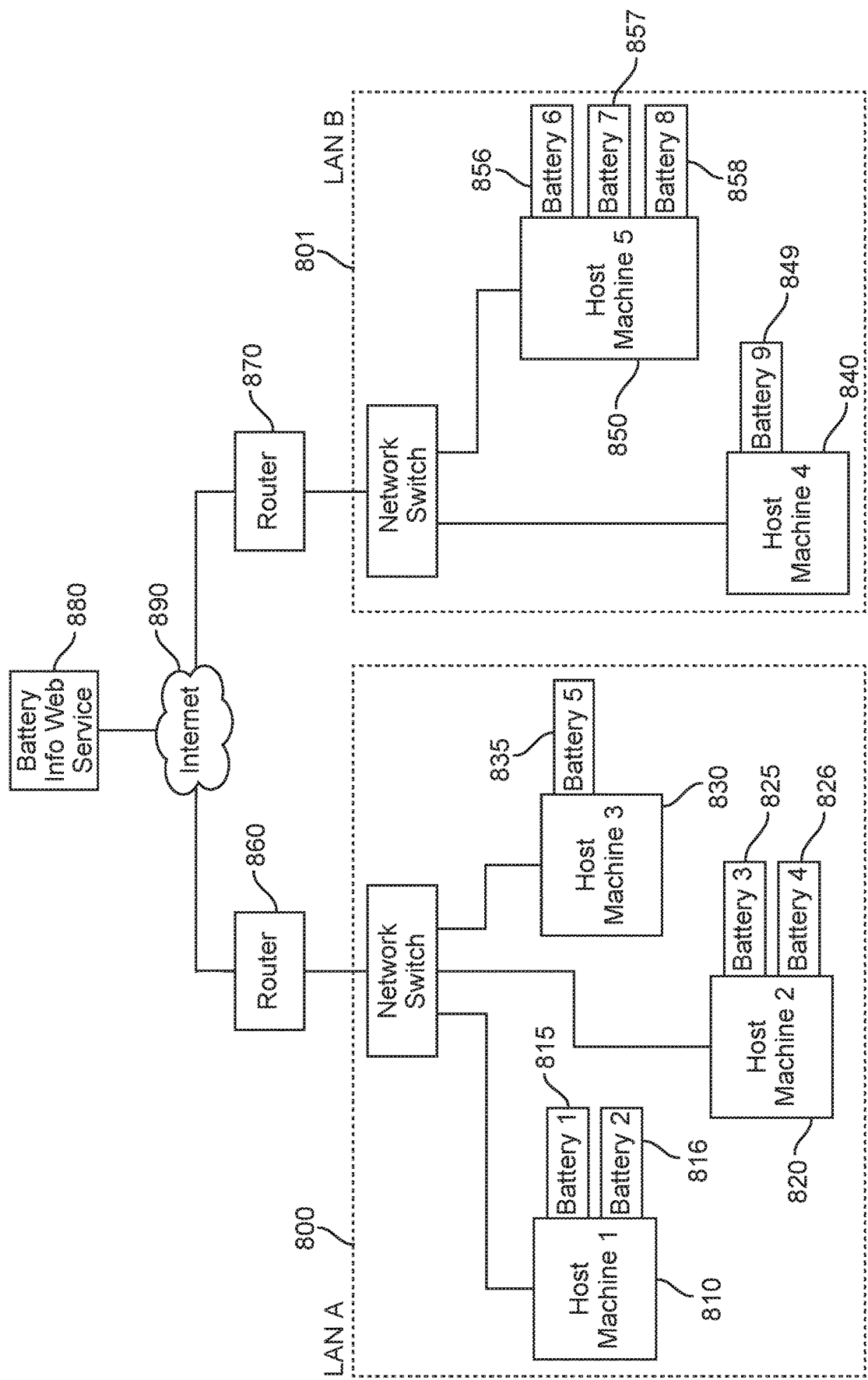
FIG. 8 shows an embodiment of a network of host machines.

FIG. 8 shows an exemplary embodiment of the current invention where a plurality of host machines are grouped together to form a network of host machines 800 and 801. In one embodiment, each host machine 810, 820, 830, 840, and 850 can be adapted to identify a battery by a battery id and store a local charging history associated with the battery id. In the embodiment, each host machine may also be adapted to share its local copies of charging histories with other host machines on the network.

The sharing of the charging histories may occur over a peer-to-peer network or a server-client network. In a peer-to-peer network, when a host machine needs to access a complete charging history of a battery, the host machine may query each of the other host machines for their copies of charging histories to form an aggregated copy of charging histories. In a sever-client network, the host machine may query a server machine for an aggregated copy of charging histories previously aggregated from each of the host machines by the server.

An exemplary aspect of the invention involves the use of a network of host machines cooperating together to increase the availability of charged rechargeable batteries when a drained battery is detected. In a standalone setup, when a battery coupled with a mobile or wireless device of a host machine is drained, a user may be directed to a slot on the host machine for a charged battery of a compatible type that the user can quickly swap. When no such battery can be found on the host machine, however, the user would have had to recharge the drained battery and wait for the battery to charge before the device containing the drained battery can be brought online again.

In a current embodiment, the user may not have to wait even when a charged battery of a compatible type cannot be found on the host machine. In one embodiment, the user may now access not just batteries on the user's host machine, but also the pool of batteries held by all host machines belonging in a network of host machines of which the user's host machine is a part. In an embodiment, the host machine may query the network of host machines to determine whether another host machine contains a charged battery of a type compatible with the drained battery. If the host machine successfully identifies another host machine containing a charged battery that can be swapped with the drained battery, the host machine may be adapted to communicate that information to the user. The user can then swap the drained battery with the battery located in the network.

If multiple charged batteries of a specific type can be found on the network, the host machine may be configured to sort a listing of batteries according to some criterion. The host machine may also suggest a particular that according to some criterion which battery to swap. In an embodiment, host machines on the same floor as the user might be preferred over host machines in other floors. Alternatively, host machines in one hall might be preferred over host machines in other halls. Host machines belonging to one group or department might also be preferred over host machines in other groups or departments. Host machines with more "surplus" of batteries might also be preferred over host machines with less "surplus" of batteries. In another embodiment, host machines with lighter work loads (hence less need to keep a large reserves of "surplus" batteries) might be preferred over host machines with greater work loads. According to another embodiment, host machines may also be adapted to allow a user to specify a list of preferred machines and to suggest batteries belonging in the preferred list. According to another embodiment, batteries may be ordered based on their quality or charging histories.

As batteries are moved around, the various battery management functions that are managed by individual host machines, including the management of the rate at which a battery is charged and the time when a battery needs to be reconditioned, may also be implemented by a network of host machines. Despite the movement of the batteries across host machines, the charging histories and other information useful for battery management may be adapted to "float" through the network with the battery as a battery is moved around the network. Host machines belonging to a network may for example be adapted to query the network for copies of charging histories for the battery. When a battery is moved from one host machine to another host machine, the new host machine may thus to continue to access the histories and to carry out battery management functions as if the battery had been used with the new host machine all along.

Figure 9A:
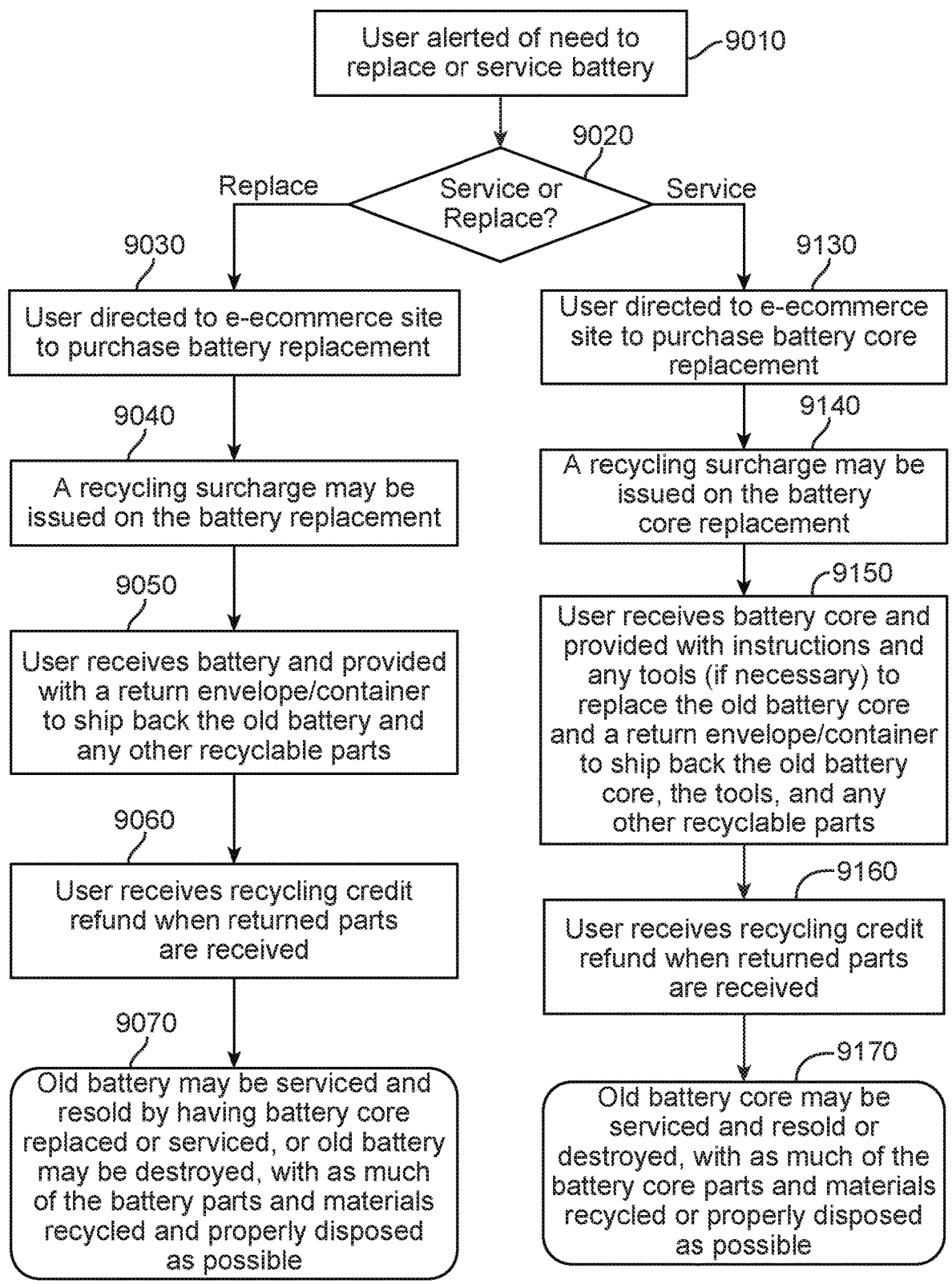
FIG. 9A shows an exemplary process through which a rechargeable battery can be serviced by an end user.

Another aspect of the invention involves a method to enable batteries to be serviced when the battery core or some of the other more perishable parts need to be replaced as the rest of the batteries are reused. FIG. 9A shows an exemplary process by which a rechargeable battery may be serviced. As shown, in the first step 9010, a user may be alerted of a need to replace or service a battery. The process may then splits into two branches. The left side of the branch, constituting steps 9030 to 9070, shows an exemplary process by which a rechargeable battery may be replaced by an end user. The right side of the branch, constituting steps 9130 to 9170, shows an exemplary process by which a rechargeable battery may be serviced by an end user.

In step 9030, the user may need to replace a battery and can be directed to an e-commerce site to purchase a replacement battery. In the embodiment, the battery may have to be sent in because the replacement of the battery core, and/or other parts, is considered too complicated to perform by the end user. In an embodiment, a recycling surcharge may be issued in step 9040 for the purchase of a battery replacement. Recycling credits equaling the surcharge may be refunded when the user return the battery later when the battery needs to be replaced. In general, according to the embodiment, the new battery may be delivered by mail or picked up in a retail store. When a user receives or picks up the battery, the user may be provided an envelope or container in which to return the old battery 9050.

When the manufacturer or recycler receives the old battery, the user can be issued a recycling refund at step 9060. The refund may be credited against the purchase price of the new battery or for future purchases in a network of e-commerce or retail establishments. At step 9070, the manufacturer or recycler can refurbish the battery by replacing components including the battery core and reselling the battery again. Alternatively the manufacturer or recycler may destroy the battery, reusing and responsibly disposing as much of the battery's parts and materials as possible.

Step 9130 may begin a series of steps for the user to service the battery directly. In step 9130, the user can be directed to an e-commerce site to purchase a replacement battery core or other replaceable components. In an embodiment, the host machine may be adapted to guide the user through the process. In an embodiment, a host machine may direct a user to an e-commerce website to purchase a battery core replacement. In an embodiment, an e-commerce website address can be provided to the user. In the embodiment, the e-commerce website address may be retrieved from the memory of the battery or the host machine. In an alternative embodiment, the address may be obtained from a web service.

Recycling credits can be given to provide an incentive for users to return the old core or other recyclable parts. In an embodiment, a recycling surcharge may be issued on the new battery core when the user purchases a replacement core at step 9140. The replacement core may be delivered by mail or can be picked up in a retail store. When the user receives the battery core at step 9150, the user can be provided with instructions and any necessary tools to replace the old battery core. The instructions should preferably be easy to follow, and the tools should be preferably easy to use.

An exemplary series of steps may include: removing the battery end cap, sliding the old battery core out of the battery shell, sliding into the battery shell the new core, which snaps or locks into a predetermined position in the battery shell. The user may also be provided a return envelop or container in which to return or ship back the old battery core. When the return envelope or container sent by the user is received by the manufacturer or designated recycler, the user can be issued a recycling refund at step 9160. The refund may be credited against the purchase price of the new battery core or used against future purchases in a network of e-commerce or retail establishments. In step 9170, the manufacturer or recycler may refurbish and resell the battery core or destroy and recycle as much of the old core as possible.

Figure 9B:
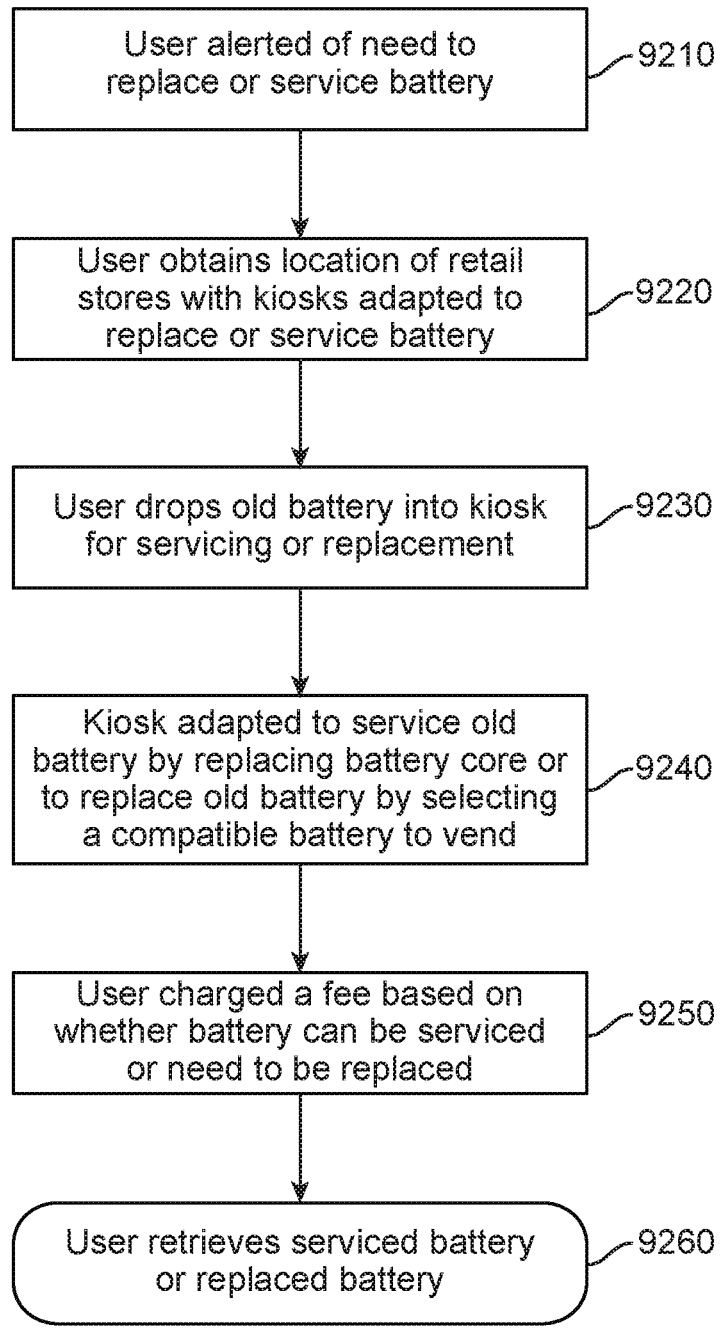
FIG. 9B shows an exemplary process through which a rechargeable battery can be serviced at a retail store kiosk.

FIG. 9B shows an exemplary process by which a rechargeable battery can be replaced at a retail store kiosk. In step 9210, a user can be alerted of a need to service or replace a battery. User can then directed at step 9220 to locations of local retail stores with kiosks adapted to replace or service the old battery. At the kiosk in step 9230, user may drop the old battery into the kiosk for servicing or replacement. In step 9240, the kiosk can be adapted to service the old battery by replacing the battery core of the old battery or by vending a compatible battery to replace the old battery.

In one embodiment, a kiosk at a retail store can contain a specialized tool attached to an automated mechanism. If the kiosk machine determines that the battery core can be replaced, the machine, potentially using the specialized tool, can remove the end cap without damaging the battery components and drop the old battery core out of the shell into an internal container used for collecting old cores to be recycled. The machine can then take a new core from an internal supply that is periodically monitored and replaced, insert the new core into the shell, replace the end cap, and run diagnostic tests to ensure that all is in working order.

If the kiosk machine determines that the battery cannot be serviced by replacing the core, it can select a new battery of a compatible type to vend to the user. At step 9250, the user may be charged a fee based on whether the battery is serviced or replaced. In step 9260, the user can retrieve a battery, which may be the old battery with a new core or a new battery compatible to be used in place of the old battery.

In a specific embodiment of an exemplary process at a kiosk, the following steps may be performed at a kiosk:

1) Push the two metallic posts out of the end cap and remove attached entire electronic subassembly from the end cap.
2) Drop the end cap shell and attached structures into a container for recycling.
3) Separate the electronic circuit from the metallic posts by breaking attachments may couple the posts to the circuit and extract components such as the magnetic switch and the positive/negative power connections for recycling.
5) Remove the electronic circuit into a separate container for proper disposal, or potentially further processing by external equipment and procedures.
6) Print a ticket for the user containing an ID number associated with the recycling credit granted to the user for this procedure. The user can then use this ID number at a physical or online retail purchase in the future. The machine has a network connection that allows it to communicate with a back-end system, that back-end system being the entity that generated the ID number and other associated data structures related to this recycling credit.
7) Alternatively, use the credit toward the purchase of a new battery at the kiosk.

This section has discussed several embodiments of the invention relating to the charging of batteries for wireless or mobile devices. The descriptions here are meant to be illustrative only and should not be taken to unnecessarily restrict the scope of the invention. While these inventions have been described in the context of the above specific embodiments, other modifications and variations are possible. A person skilled in the arts would understand that many variations can be made to these embodiments without departing from the spirit or scope of the invention. Accordingly, the scope and breadth of the present invention should not be limited by the specific embodiments described above and should instead be determined by the following claims and their full extend of equivalents.

What is claimed is:

1. An automated system comprising:
an automated mechanism;
a specialized tool attached to the automated mechanism, wherein the automated mechanism uses the specialized tool to disassemble batteries for electronic devices, wherein the specialized tool disassembles each battery by separating a battery core, an end cap, and a battery component, and wherein the specialized tool separates the end cap without damaging the battery component; and
a plurality of containers, wherein the automated mechanism puts the separated parts of the batteries for electronic devices into corresponding containers in the plurality of containers.

2. The automated system of claim 1 wherein separated parts in a first container are recycled.

3. The automated system of claim 2 wherein separated parts in a second container are further processed by external equipment.

4. The automated system of claim 2 wherein two of the separated parts are separated by breaking an attachment between them.

5. The automated system of claim 2 wherein the automated mechanism uses the specialized tool to disassemble batteries for electronic devices into separated parts without human intervention.

6. The automated system of claim 1 wherein the automated mechanism disassembles the batteries for electronic devices by separating the end cap from a housing.

7. The automated system of claim 1 wherein the automated mechanism is located in a kiosk.

8. An automated system comprising:
an automated mechanism to determine whether an electronic device can be serviced by replacing a component;
a specialized tool attached to the automated mechanism, wherein in response to the automated mechanism determining that the electronic device can be serviced by replacing the component, the automated mechanism removes the component using the specialized tool; and
a first container, wherein further in response to the automated mechanism determining that the electronic device can be serviced by replacing the component, the automated mechanism puts the removed component in the first container,
wherein further in response to the automated mechanism determining that the electronic device can be serviced by replacing the component, the automated mechanism selects a replacement component and inserts the replacement component in the electronic device, and
wherein in response to the automated mechanism determining that the electronic device cannot be serviced by replacing the component, the automated mechanism disassembles the electronic device into separate parts.

9. The automated system of claim 8 wherein further in response to the automated mechanism determining that the electronic device can be serviced by replacing the component, the automated mechanism further tests the electronic device with the replacement component.

10. The automated system of claim 8 further comprising a plurality of containers including the first container, wherein further in response to the automated mechanism determining that the electronic device cannot be serviced by replacing the component, the automated mechanism puts parts of the electronic device into corresponding containers in the plurality of containers.

11. The automated system of claim 10 wherein parts in the first container are recycled.

12. The automated system of claim 11 wherein parts in a second container are further processed by external equipment.

13. The automated system of claim 11 wherein two parts are separated by breaking an attachment between them.

14. An automated system comprising:
an automated mechanism to determine whether a battery can be serviced by replacing a battery core;
a specialized tool attached to the automated mechanism, wherein in response to the automated mechanism determining that the battery can be serviced by replacing the battery core, the automated mechanism removes a portion of a housing from the battery and removes the battery core using the specialized tool; and
a first container, wherein further in response to the automated mechanism determining that the battery can be serviced by replacing the battery core, the automated mechanism puts the removed battery core in the first container,
wherein further in response to the automated mechanism determining that the battery can be serviced by replacing the battery core, the automated mechanism further selects a replacement battery core and inserts the replacement battery core in the battery, and wherein in response to the automated mechanism determining that the battery cannot be serviced by replacing the battery core, the automated mechanism does not insert a replacement battery core in the battery.

15. The automated system of claim 14 wherein in response to the automated mechanism determining that the battery can be serviced by replacing the battery core, the automated mechanism further tests the battery with the replacement battery core.

16. The automated system of claim 14 wherein removed battery cores in the first container are recycled.

17. The automated system of claim 14 wherein removed battery cores in the first container are further processed by external equipment.

18. The automated system of claim 14 where in response to the automated mechanism determining that the battery cannot be serviced by replacing the battery core, the automated mechanism disassembles the battery.

19. The automated system of claim 14 where in response to the automated mechanism determining that that the battery cannot be serviced by replacing the battery core, the automated mechanism further removes metallic posts from the removed portion of the housing.

20. The automated system of claim 1 wherein the specialized tool further repairs a battery by replacing the battery core and reattaching the end cap and the battery component.

* * * * *